(12) United States Patent
Kakizaki et al.

(10) Patent No.: US 11,604,416 B2
(45) Date of Patent: Mar. 14, 2023

(54) LASER PROCESSING METHOD AND LASER PROCESSING SYSTEM

(71) Applicant: Gigaphoton Inc., Tochigi (JP)

(72) Inventors: Koji Kakizaki, Oyama (JP); Masakazu Kobayashi, Oyama (JP); Akira Suwa, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/511,128

(22) Filed: Oct. 26, 2021

(65) Prior Publication Data

US 2022/0050382 A1 Feb. 17, 2022

Related U.S. Application Data

(63) Continuation of application No. 16/812,784, filed on Mar. 9, 2020, now Pat. No. 11,194,255, which is a (Continued)

(51) Int. Cl.
*G03F 7/20* (2006.01)
*H01S 3/11* (2023.01)
(Continued)

(52) U.S. Cl.
CPC ...... *G03F 7/70025* (2013.01); *G03F 7/70041* (2013.01); *G03F 7/70325* (2013.01);
(Continued)

(58) Field of Classification Search
CPC ..... B23K 26/02; B23K 26/50; G03F 7/70025; G03F 7/70041; G03F 7/70325;
(Continued)

(56) References Cited

U.S. PATENT DOCUMENTS

| 4,441,008 A | 4/1984 | Chan |
| 6,252,648 B1 | 6/2001 | Hase et al. |
| (Continued) | | |

FOREIGN PATENT DOCUMENTS

| CN | 1533514 A | 9/2004 |
| CN | 1683995 A | 10/2005 |
| (Continued) | | |

OTHER PUBLICATIONS

International Search Report issued in PCT/JP2017/036130; dated Jan. 16, 2018.

(Continued)

*Primary Examiner* — Peter B Kim
(74) *Attorney, Agent, or Firm* — Studebaker & Brackett PC

(57) ABSTRACT

A laser processing method of performing laser processing on a transparent material that is transparent to ultraviolet light by using a laser processing system includes: performing relative positioning of a transfer position of a transfer image and the transparent material in an optical axis direction of a pulse laser beam so that the transfer position is set at a position inside the transparent material at a predetermined depth $\Delta Zsf$ from a surface of the transparent material in the optical axis direction; and irradiating the transparent material with the pulse laser beam having a pulse width of 1 ns to 100 ns inclusive and a beam diameter of 10 μm to 150 μm inclusive at the transfer position.

20 Claims, 16 Drawing Sheets

Related U.S. Application Data continuation of application No. PCT/JP2017/036130, filed on Oct. 4, 2017.

(51) Int. Cl.
*H01S 3/225* (2006.01)
*G03F 9/00* (2006.01)

(52) U.S. Cl.
CPC ...... *G03F 7/70333* (2013.01); *G03F 7/70725* (2013.01); *G03F 9/7026* (2013.01); *H01S 3/11* (2013.01); *H01S 3/2251* (2013.01)

(58) Field of Classification Search
CPC ............. G03F 7/70333; G03F 7/70725; G03F 9/7026; H01S 3/005; H01S 3/0071; H01S 3/0092; H01S 3/0971; H01S 3/11; H01S 3/1301; H01S 3/134; H01S 3/2251; H01S 3/2308; H01S 3/2316; H01S 3/2325; H01S 3/2375; H01S 5/0612
See application file for complete search history.

(56) References Cited

U.S. PATENT DOCUMENTS

| | | | |
|---|---|---|---|
| 6,627,844 B2 | 9/2003 | Liu et al. | |
| 10,017,410 B2 * | 7/2018 | Hosseini | ............. G11B 5/8404 |
| 2004/0246565 A1 | 12/2004 | Sekine et al. | |
| 2005/0233511 A1 | 10/2005 | You | |
| 2010/0225027 A1 | 9/2010 | Jozaki et al. | |
| 2011/0287347 A1 | 11/2011 | Sakai et al. | |
| 2017/0096361 A1 | 4/2017 | Horiuchi et al. | |
| 2017/0279241 A1 | 9/2017 | Onose et al. | |
| 2019/0273038 A1 | 9/2019 | Nagano et al. | |
| 2019/0283179 A1 * | 9/2019 | Kakizaki | .............. B23K 26/142 |

FOREIGN PATENT DOCUMENTS

| | | | | |
|---|---|---|---|---|
| CN | 101823180 | A | 9/2010 | |
| CN | 101854018 | A | 10/2010 | |
| CN | 102601530 | A | 7/2012 | |
| CN | 102722061 | A | 10/2012 | |
| CN | 103212786 | A | 7/2013 | |
| CN | 107112708 | A | 8/2017 | |
| JP | H03-157917 | A | 7/1991 | |
| JP | H05-32428 | A | 2/1993 | |
| JP | H10-113780 | A | 5/1998 | |
| JP | H10-284792 | A | 10/1998 | |
| JP | H11224839 | A | 8/1999 | |
| JP | 2000-031574 | A | 1/2000 | |
| JP | 3799060 | B2 | 7/2006 | |
| JP | 2006-297478 | A | 11/2006 | |
| WO | 97/03846 | A1 | 2/1997 | |
| WO | WO-2018100638 | A1 * | 6/2018 | ........... B23K 26/032 |

OTHER PUBLICATIONS

International Preliminary Report On Patentability and Written Opinion issued in PCT/JP2017/036130; dated Apr. 8, 2020.

An Office Action mailed by China National Intellectual Property Administration dated Sep. 2, 2021, which corresponds to Chinese U.S. Appl. No. 16/812,784.1 and is related to U.S. Appl. No. 16/812,784; with English language translation.

An Office Action; "Notice of Reasons for Refusal", mailed by the Japanese Patent Office dated Nov. 1, 2021 which corresponds to Japanese Patent Application No. 2019-546461 and is related to U.S. Appl. No. 17/511,128; with English language translation.

An Office Action mailed by China National Intellectual Property Administration dated Mar. 7, 2022, which corresponds to Chinese Patent Application No. 201780094447.1 and is related to U.S. Appl. No. 17/511,128; with English language translation.

* cited by examiner

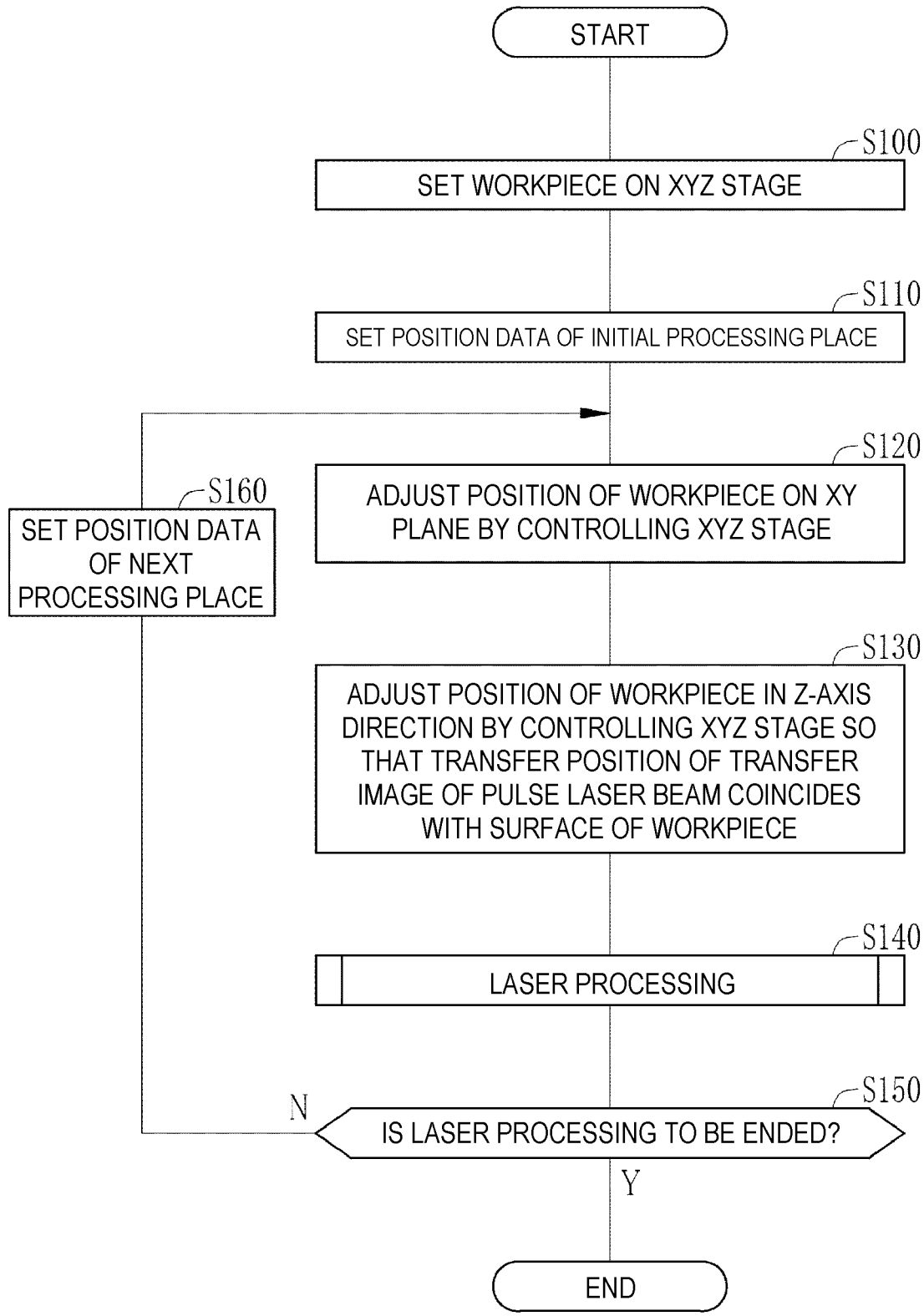

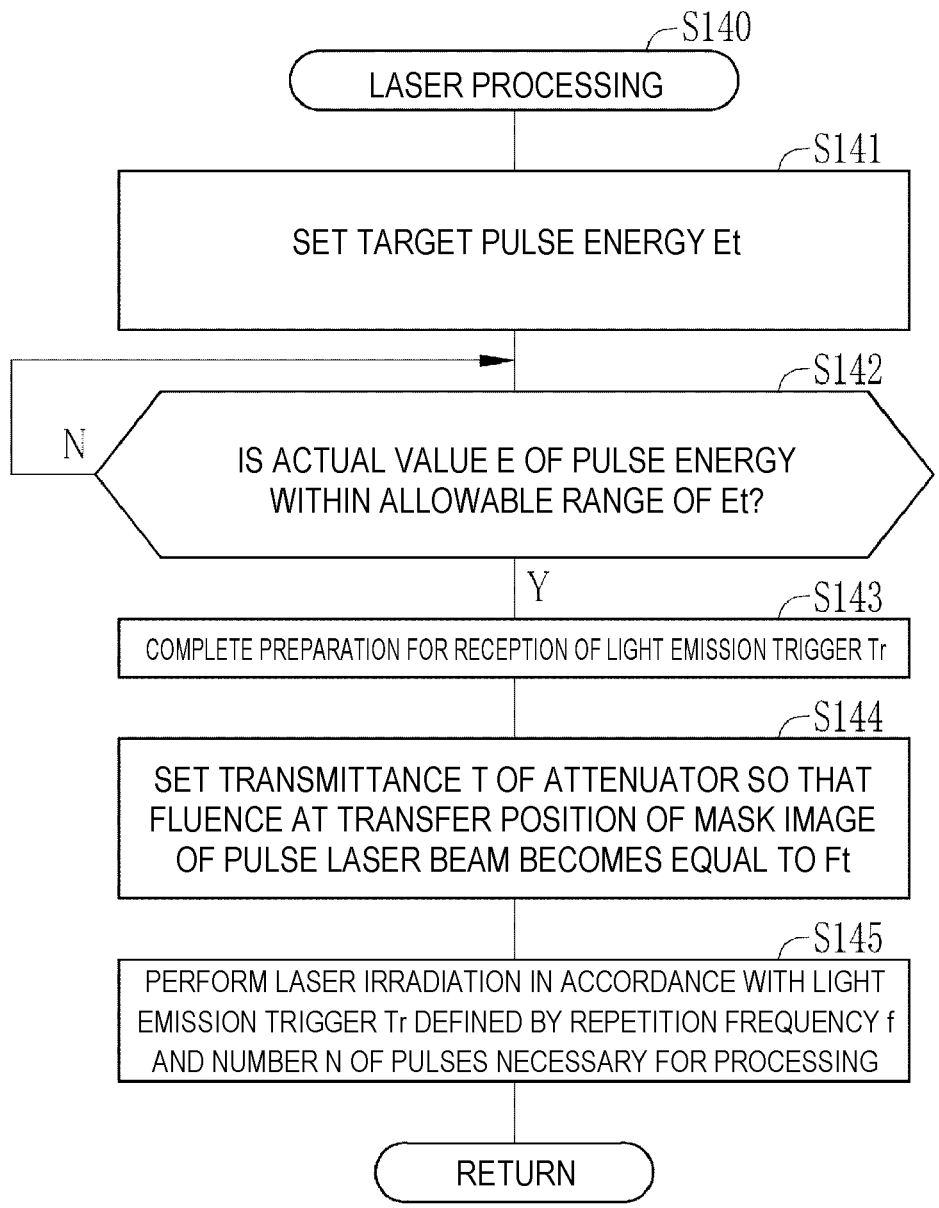

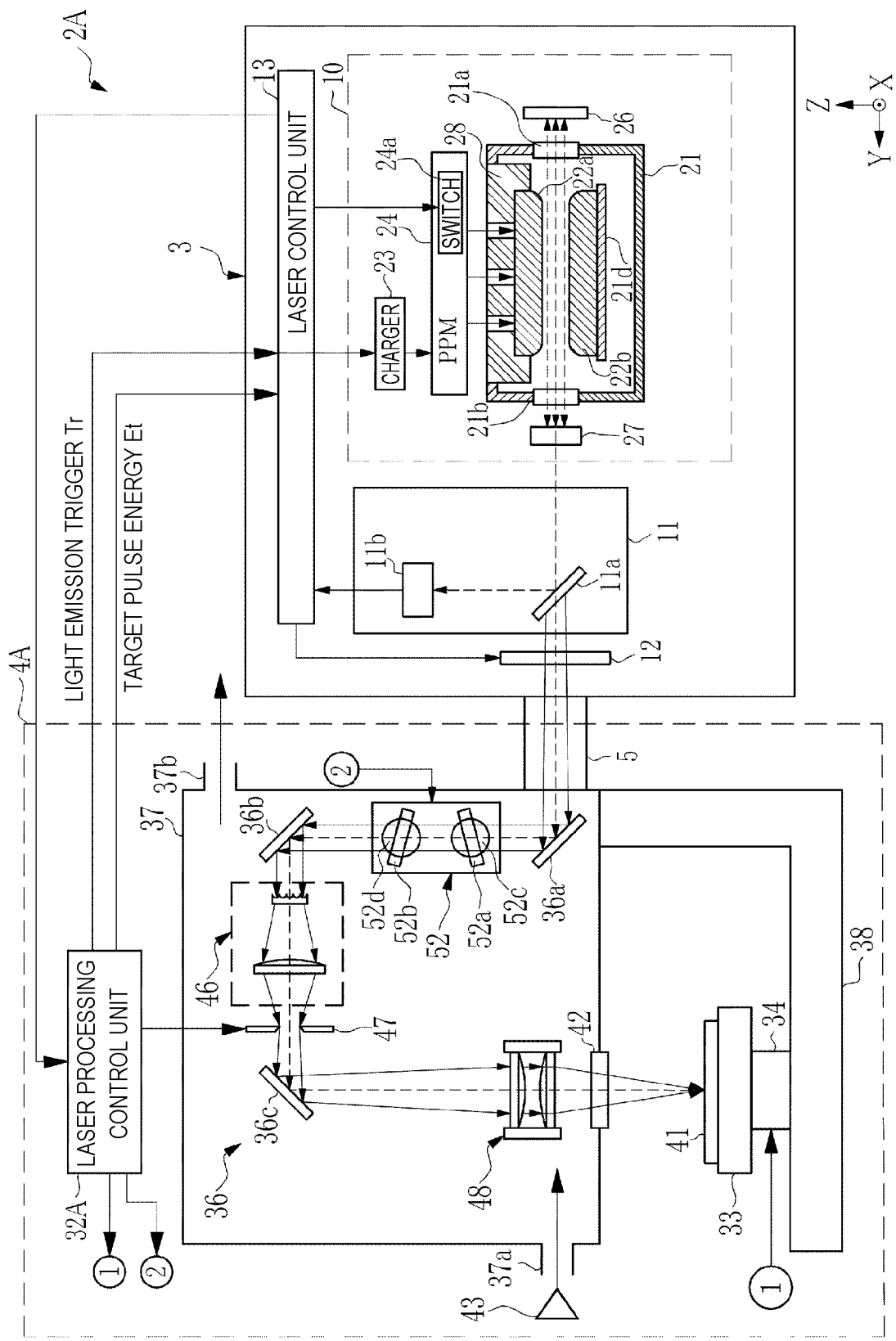

LASER PROCESSING METHOD AND LASER PROCESSING SYSTEM

CROSS-REFERENCE TO RELATED APPLICATIONS

The present application is a Continuation of U.S. patent application Ser. No. 16/812,784 filed on Mar. 9, 2020, which is a continuation application of International Application No. PCT/JP2017/036130 filed on Oct. 4, 2017. The content of the application is incorporated herein by reference in its entirety.

BACKGROUND

1. Technical Field

The present disclosure relates to a laser processing method and a laser processing system.

2. Related Art

Improvement of the resolution of a semiconductor exposure device has been requested along with miniaturization and high integration of a semiconductor integrated circuit. Hereinafter, the semiconductor exposure device is simply referred to as an "exposure device". Thus, the wavelength of light output from an exposure light source has been shortened. A gas laser device is used as the exposure light source in place of a conventional mercury lamp. Currently used exposure gas laser devices are a KrF excimer laser device configured to output ultraviolet having a central wavelength of 248.4 nm approximately and an ArF excimer laser device configured to output ultraviolet having a central wavelength of 193.4 nm approximately.

The current exposure technology in practical use is, for example, liquid immersion exposure in which the gap between a projection lens on the exposure device side and a wafer is filled with liquid to change the refractive index of the gap so that the apparent wavelength of the exposure light source is shortened. When the liquid immersion exposure is performed by using the ArF excimer laser device as the exposure light source, the wafer is irradiated with ultraviolet light having a wavelength of 134 nm in the water. This technology is called ArF liquid immersion exposure. The ArF liquid immersion exposure is also called ArF liquid immersion lithography.

The KrF and ArF excimer laser devices each have a wide spectrum line width of 350 pm to 400 pm approximately due to spontaneous oscillation, and thus suffers chromatic aberration of a laser beam (ultraviolet light) projected on the wafer in a reduced size through the projection lens on the exposure device side, which leads to decrease of the resolution. To avoid this, the spectrum line width of a laser beam output from the gas laser device needs to be narrowed until the chromatic aberration becomes negligible. The spectrum line width is also called spectrum width. Thus, a line narrowing module including a line narrowing element is provided in a laser resonator of the gas laser device to achieve the spectrum width narrowing. The line narrowing element may be, for example, an etalon or a grating. A laser device having a narrowed spectrum width in this manner is referred to as a line narrowing laser device.

An excimer laser beam has a pulse width of 1 ns to 100 ns and a short central wavelength of 248.4 nm or 193.4 nm. With these characteristics, the excimer laser beam is sometimes used in direct processing of a polymer material, a glass material, and the like in addition to exposure usage. Bonding of a polymer material can be disconnected by the excimer laser beam having photon energy higher than the bond energy. Accordingly, non-heating processing is possible, and it is known that a clean processing shape is obtained. For example, glass and ceramics have high absorbance for the excimer laser beam, and thus it is known that materials difficult to process with visible and infrared laser beams can be processed with the excimer laser beam.

LIST OF DOCUMENTS

Patent Documents

Patent Document 1: Japanese Unexamined Patent Application Publication No. 10-284792
Patent Document 2: Japanese Unexamined Patent Application Publication No. 11-224839
Patent Document 3: Japanese Patent No. 3799060
Patent Document 4: Japanese Unexamined Patent Application Publication No. 3-157917
Patent Document 5: Japanese Unexamined Patent Application Publication No. 2000-031574

SUMMARY

A laser processing method according to an aspect of the present disclosure performs laser processing on a transparent material that is transparent to ultraviolet light by using a laser processing system including a laser apparatus configured to output a pulse laser beam that is the ultraviolet light, a transfer mask provided with a transfer pattern through which the pulse laser beam passes, and a transfer optical system configured to transfer a transfer image formed when the pulse laser beam passes through the transfer pattern and having a shape in accordance with the transfer pattern, the laser processing method including:

A. a positioning step of performing relative positioning of a transfer position of the transfer image transferred by the transfer optical system and the transparent material in an optical axis direction of the pulse laser beam so that the transfer position is set at a position inside the transparent material at a predetermined depth $\Delta Zsf$ from a surface of the transparent material in the optical axis direction; and B. an irradiation step of irradiating the transparent material with the pulse laser beam having a pulse width of 1 ns to 100 ns inclusive and a beam diameter of 10 μm to 150 μm inclusive at the transfer position.

A laser processing method according to another aspect of the present disclosure performs laser processing on a transparent material that is transparent to ultraviolet light by using a laser processing system including a laser apparatus configured to output a pulse laser beam that is the ultraviolet light and a condensation optical system configured to condense the pulse laser beam, the laser processing method including:

A. a positioning step of performing relative positioning of a beam waist position of the pulse laser beam and the transparent material in an optical axis direction of the pulse laser beam so that the beam waist position is set at a position inside the transparent material at a predetermined depth $\Delta Zsf$ from a surface of the transparent material in the optical axis direction; and B. an irradiation step of irradiating the transparent material with the pulse laser beam having a pulse width of 1 ns to 100 ns inclusive and a beam diameter of 10 μm to 150 μm inclusive at the beam waist position.

A laser processing system according to another aspect of the present disclosure performs laser processing by irradiating a transparent material that is transparent to ultraviolet light with a pulse laser beam that is the ultraviolet light, the laser processing system including:

A. a laser apparatus configured to output the pulse laser beam having a pulse width of 1 ns to 100 ns inclusive;

B. a transfer mask provided with a transfer pattern through which the pulse laser beam output from the laser apparatus passes;

C. a transfer optical system configured to transfer, onto the transparent material, a transfer image formed when the pulse laser beam passes through the transfer pattern and having a shape in accordance with the transfer pattern;

D. a positioning mechanism configured to perform relative positioning of a transfer position of the transfer image transferred by the transfer optical system and the transparent material in an optical axis direction of the pulse laser beam; and E. a positioning control unit configured to control the positioning mechanism to perform the positioning so that the transfer position is set at a position inside the transparent material at a predetermined depth $\Delta Zsf$ from a surface of the transparent material in the optical axis direction, the pulse laser beam having a beam diameter of 10 μm to 150 μm inclusive at the transfer position.

BRIEF DESCRIPTION OF THE DRAWINGS

Embodiments of the present disclosure will be described below as examples with reference to the accompanying drawings.

FIG. 2 is a flowchart illustrating a laser processing procedure of the comparative example.

FIG. 3 is a flowchart illustrating the processing procedure of laser processing of the comparative example.

FIG. 4A illustrates a state of irradiation with a pulse laser beam while a transfer position of the pulse laser beam is adjusted to a surface of a workpiece. FIG. 4B illustrates a processing state of the workpiece through irradiation with the pulse laser beam.

FIG. 5 schematically illustrates a configuration of a laser processing system of a first embodiment.

FIG. 8A illustrates a state of irradiation with the pulse laser beam while the transfer position of the pulse laser beam is adjusted to a position inside a surface of the workpiece at a depth $\Delta Zsf$. FIG. 8B illustrates a processing state of the workpiece right after the pulse laser irradiation. FIG. 8C illustrates a self-focusing state of the pulse laser beam. FIG. 8D illustrates the processing state of the workpiece through the irradiation with the pulse laser beam.

DESCRIPTION OF EMBODIMENTS

<Contents>
1. Overview
2. Laser processing system and laser processing method according to comparative example
  2.1 Configuration
  2.2 Operation
  2.3 Problem
3. Laser processing system and laser processing method of first embodiment
  3.1 Configuration
  3.2 Operation
  3.3 Effect
  3.4 Preferable processing conditions
  3.5 Other
4. Laser processing system and laser processing method of second embodiment
  4.1 Configuration
  4.2 Operation
  4.3 Effect
  4.4 Modification of laser processing device
5. Modifications of laser apparatus
  5.1 Modification 1
  5.2 Modification 2

Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

The present disclosure relates to a laser processing system and a laser processing method that perform laser processing by irradiating a workpiece with a laser beam.

Figure 1:
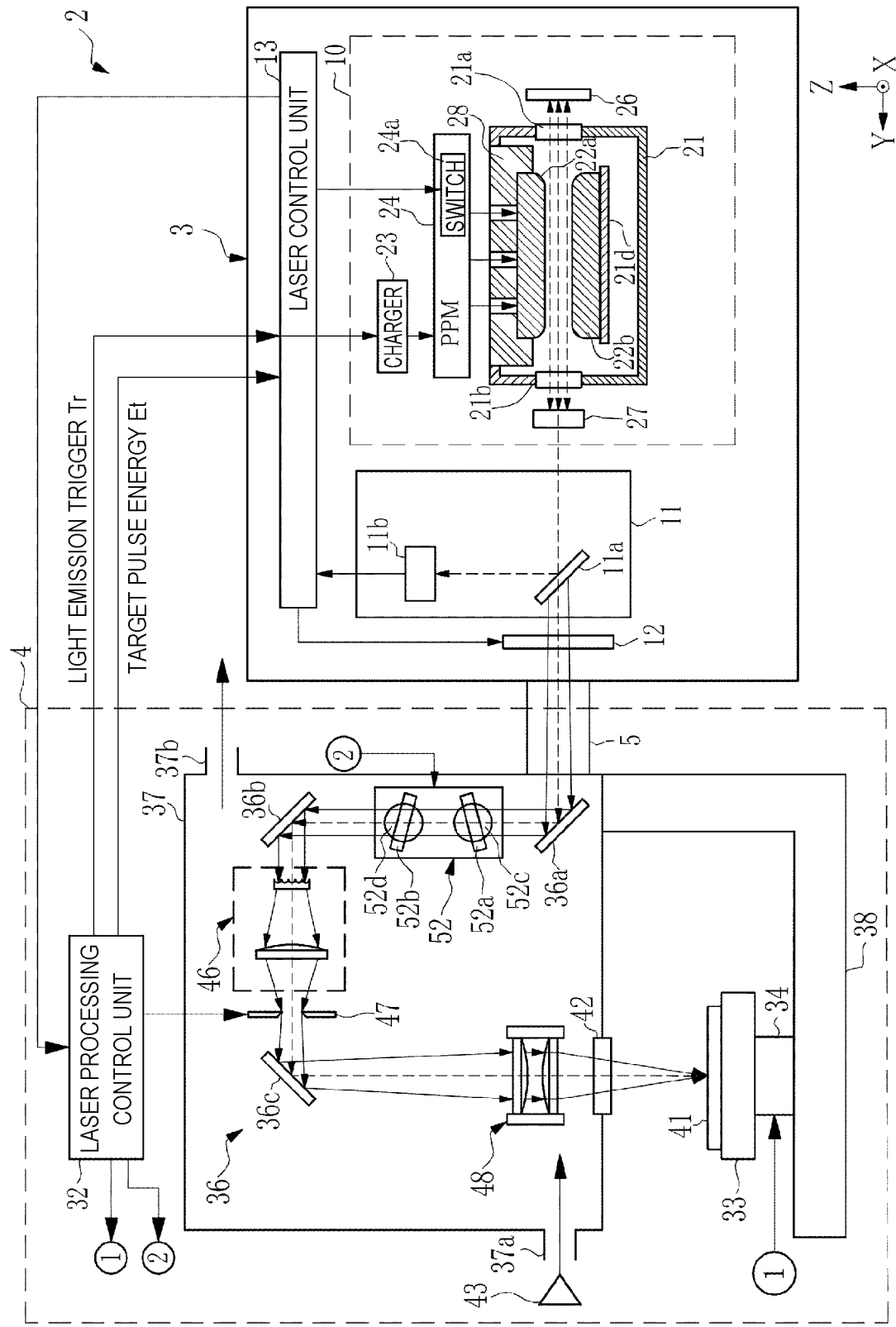
FIG. 1 schematically illustrates a configuration of a laser processing system of a comparative example.

2. Laser Processing System and Laser Processing Method According to Comparative Example 2.1 Configuration FIG. 1 schematically illustrates a configuration of a laser processing system according to a comparative example. This laser processing system 2 includes a laser apparatus 3 and a laser processing device 4. The laser apparatus 3 and the laser processing device 4 are connected with each other through an optical path pipe 5.

The laser apparatus 3 includes a master oscillator 10, a monitor module 11, a shutter 12, and a laser control unit 13.

The laser apparatus 3 is an ArF excimer laser apparatus configured to use, as a laser medium, ArF laser gas containing argon (Ar) and fluorine (F). The laser apparatus 3 outputs an ultraviolet pulse laser beam that is an ArF laser beam having a central wavelength of 193.4 nm approximately.

The master oscillator 10 includes a laser chamber 21, a pair of electrodes 22a and 22b, a charger 23, and a pulse power module (PPM) 24. FIG. 1 illustrates an internal configuration of the laser chamber 21 in a direction substantially orthogonal to a traveling direction of a laser beam.

The laser chamber 21 encapsulates the ArF laser gas. The electrodes 22a and 22b are disposed in the laser chamber 21 as electrodes for exciting the laser medium by electric discharge.

An opening is formed in the laser chamber 21 and blocked by an electric insulating member 28. The electrode 22a is supported by the electric insulating member 28, and the electrode 22b is supported by a return plate 21d. The return plate 21d is connected with an inner surface of the laser chamber 21 through a wire (not illustrated). A conductive member is embedded in the electric insulating member 28. The conductive member applies, to the electrode 22a, a high voltage supplied from the pulse power module 24.

The charger 23 is a direct-current power supply device configured to charge a charging capacitor (not illustrated) in the pulse power module 24 at a predetermined voltage. The pulse power module 24 includes a switch 24a controlled by the laser control unit 13. When the switch 24a being off is turned on, the pulse power module 24 generates a pulse high voltage from electric energy held at the charger 23, and applies the high voltage between the electrodes 22a and 22b.

When the high voltage is applied between the electrodes 22a and 22b, insulation between the electrodes 22a and 22b is broken, and electric discharge occurs. Each laser medium in the laser chamber 21 is excited by the energy of the electric discharge and transitions to a high energy level. Thereafter, as the excited laser medium transitions to a low energy level, light is emitted in accordance with the difference between the energy levels.

Windows 21a and 21b are provided at both ends of the laser chamber 21. Light generated in the laser chamber 21 is emitted out of the laser chamber 21 through the windows 21a and 21b.

The master oscillator 10 further includes a rear mirror 26 and an output coupling mirror 27. The rear mirror 26 is coated with a high reflection film, and the output coupling mirror 27 is coated with a partial reflection film. The rear mirror 26 reflects, at high reflectance, light emitted through the window 21a of the laser chamber 21, and returns the light to the laser chamber 21. The output coupling mirror 27 transmits and outputs part of light output through the window 21b of the laser chamber 21, and reflects the other part back into the laser chamber 21.

Thus, the rear mirror 26 and the output coupling mirror 27 constitute an optical resonator. The laser chamber 21 is disposed on the optical path of the optical resonator. While traveling forward and backward between the rear mirror 26 and the output coupling mirror 27, light emitted from the laser chamber 21 is amplified each time the light passes through a laser gain space between the electrodes 22a and 22b. Part of the amplified light is output as a pulse laser beam through the output coupling mirror 27.

The monitor module 11 is disposed on the optical path of the pulse laser beam emitted from the master oscillator 10. The monitor module 11 includes, for example, a beam splitter 11a and an optical sensor 11b.

The beam splitter 11a transmits, toward the shutter 12 at high transmittance, the pulse laser beam emitted from the master oscillator 10, and reflects part of the pulse laser beam toward a light receiving surface of the optical sensor 11b. The optical sensor 11b detects the pulse energy of the pulse laser beam incident on the light receiving surface, and outputs data of the detected pulse energy to the laser control unit 13.

The laser control unit 13 communicates various signals with a laser processing control unit 32. For example, the laser control unit 13 receives, for example, data of a light emission trigger Tr and a target pulse energy Et from the laser processing control unit 32. The laser control unit 13 transmits a setting signal for a charge voltage to the charger 23, and transmits a command signal for turning on or off the switch 24a to the pulse power module 24.

The laser control unit 13 receives the pulse energy data from the monitor module 11, and controls the charge voltage of the charger 23 with reference to the received pulse energy data. The pulse energy of the pulse laser beam is controlled through the control of the charge voltage of the charger 23.

The shutter 12 is disposed on the optical path of the pulse laser beam having passed through the beam splitter 11a of the monitor module 11. The laser control unit 13 controls the shutter 12 to close until the difference between the pulse energy received from the monitor module 11 and the target pulse energy Et becomes within an allowable range after start of laser oscillation. When the difference between the pulse energy received from the monitor module 11 and the target pulse energy Et becomes within the allowable range, the laser control unit 13 controls the shutter 12 to open. The laser control unit 13 transmits, in synchronization with a signal for opening the shutter 12, a signal indicating that it has become possible to receive the light emission trigger Tr of the pulse laser beam to the laser processing control unit 32 of the laser processing device 4.

The laser processing device 4 includes the laser processing control unit 32, a table 33, an XYZ stage 34, an optical system 36, a housing 37, and a frame 38. The optical system 36 is disposed in the housing 37. The housing 37 and the XYZ stage 34 are fixed to the frame 38.

The table 33 supports a workpiece 41. The workpiece 41 is a processing target to be irradiated with the pulse laser beam and subjected to laser processing. The workpiece 41 is a transparent material that is transparent to an ultraviolet pulse laser beam, and is, for example, synthetic quartz glass. The laser processing is, for example, hole processing that produces a hole in the workpiece 41. The XYZ stage 34 supports the table 33. The XYZ stage 34 is movable in an X-axis direction, a Y-axis direction, and a Z-axis direction, and the position of the workpiece 41 can be adjusted by adjusting the position of the table 33. The XYZ stage 34 adjusts the position of the workpiece 41 under control of the laser processing control unit 32 so that the pulse laser beam emitted from the optical system 36 is incident on a desired processing place.

For example, the laser processing system 2 performs hole processing at one position or a plurality of positions on the workpiece 41. Position data in accordance with a plurality of processing places is sequentially set to the laser processing control unit 32. The position data of each processing place is, for example, coordinate data that defines the positions of the processing place in the X-axis direction, the Y-axis direction, and the Z-axis direction with respect to the origin of the XYZ stage 34. The laser processing control unit 32 performs positioning of the workpiece 41 on the XYZ stage 34 by controlling a moving amount of the XYZ stage 34 based on the coordinate data.

The optical system 36 includes, for example, high reflectance mirrors 36a to 36c, a beam homogenizer 46, a transfer mask 47, and a transfer lens 48, and transfers an image corresponding to a processing shape onto the surface of the workpiece 41. The high reflectance mirrors 36a to 36c, the beam homogenizer 46, the transfer mask 47, and the transfer lens 48 are each fixed to a holder (not illustrated) and disposed at a predetermined position in the housing 37.

The high reflectance mirrors 36a to 36c each reflect the pulse laser beam in the ultraviolet region at high reflectance. The high reflectance mirror 36a reflects, toward the high reflectance mirror 36b, the pulse laser beam input from the laser apparatus 3, and the high reflectance mirror 36b reflects the pulse laser beam toward the high reflectance mirror 36c. The high reflectance mirror 36c reflects the pulse laser beam toward the transfer lens 48. In the high reflectance mirrors 36a to 36c, for example, a surface of a transparent substrate made of, synthetic quartz or calcium fluoride is coated with a reflective film that highly reflects the pulse laser beam.

The beam homogenizer 46 and the transfer mask 47 are disposed on the optical path between the high reflectance mirrors 36b and 36c. The beam homogenizer 46 includes a fly-eye lens 46a and a condenser lens 46b. The beam homogenizer 46 is disposed to homogenize light intensity distribution of the pulse laser beam reflected at the high reflectance mirror 36b and perform Koehler illumination of the transfer mask 47.

The transfer mask 47 forms the image of the pulse laser beam corresponding to the processing shape to be transferred onto the workpiece 41 by allowing part of the pulse laser beam emitted from the beam homogenizer 46 to pass therethrough. For example, the transfer mask 47 is obtained by forming, on a light-shielding plate having a light-shielding property for shielding the pulse laser beam, for example, a transfer pattern configured by a transmission hole through which light passes. Hereinafter, the image of the pulse laser beam that is formed in accordance with the shape of the transfer pattern of the transfer mask 47 is referred to as a transfer image.

In the present example, the transfer pattern of the transfer mask 47 is a circular pinhole. By using such a transfer mask 47, the laser processing device 4 of the present example performs, on the workpiece 41, hole processing that forms a hole having a circular section. The transfer mask 47 includes a change mechanism capable of changing a size of the pinhole, and can adjust the size of the pinhole in accordance with a dimension of processing on the workpiece 41. The laser processing control unit 32 adjusts the size of the pinhole by controlling the change mechanism of the transfer mask 47.

The transfer lens 48 condenses the pulse laser beam incident thereon, and emits the condensed pulse laser beam toward the workpiece 41 through a window 42. The transfer lens 48 constitutes a transfer optical system through which the transfer image generated as the pulse laser beam passes through the transfer mask 47 and having the shape of the pinhole is imaged at a position in accordance with the focal length of the transfer lens 48. Hereinafter, the imaging position at which the transfer image is imaged by the effect of the transfer lens 48 is referred to as a transfer position.

The transfer position is set at a position that coincides with a surface on the incident side on which the pulse laser beam is incident in the Z-axis direction. Hereinafter, the surface of the workpiece 41 means the surface of the workpiece 41 on the incident side unless otherwise stated. The Z-axis direction is parallel to the optical axis direction of the pulse laser beam emitted from the transfer lens 48 and incident on the workpiece 41.

The transfer lens 48 is configured as a combination of a plurality of lenses. The transfer lens 48 is a reduction optical system through which the transfer image in the pinhole shape having a dimension smaller than the actual dimension of the pinhole provided to the transfer mask 47 is imaged on the transfer position. The transfer optical system constituted by the transfer lens 48 has, for example, a magnification M of $1/10$ to $1/5$. The transfer lens 48 is a combination lens in the present example, but may be configured as a single lens when one small circular transfer image is imaged near the optical axis of the transfer lens 48.

The window 42 is disposed on the optical path between the transfer lens 48 and the workpiece 41, and fixed to an opening formed in the housing 37 while being sealed by an O ring (not illustrated).

An attenuator 52 is disposed on the optical path between the high reflectance mirror 36a and the high reflectance mirror 36b in the housing 37. The attenuator 52 includes, for example, two partially reflective mirrors 52a and 52b, and rotation stages 52c and 52d of these partially reflective mirrors. The two partially reflective mirrors 52a and 52b are optical elements, the transmittance of each of which changes in accordance with the incident angle of the pulse laser beam. The tilt angles of the partially reflective mirrors 52a and 52b are adjusted by the rotation stages 52c and 52d so that the incident angle of the pulse laser beam is equal therebetween and desired transmittance is obtained.

Accordingly, the pulse laser beam is dimmed to desired pulse energy and passes through the attenuator 52. Transmittance T of the attenuator 52 is controlled based on a control signal from the laser processing control unit 32. In addition to control of the fluence of the pulse laser beam output from the laser apparatus 3 through the target pulse energy Et, the laser processing control unit 32 controls the fluence of the pulse laser beam through control of the transmittance T of the attenuator 52. The fluence can be changed by changing the target pulse energy Et, but it is difficult to largely change the pulse energy at the master oscillator 10 of the laser apparatus 3. The fluence can be changed by using the attenuator 52 even when output from the master oscillator 10 is constant.

Nitrogen ($N_2$) gas, which is inert gas, always flows inside the housing 37 while the laser processing system 2 is in operation. The housing 37 is provided with an intake port 37a through which the nitrogen gas is taken into the housing 37, and a discharge port 37b through which the nitrogen gas is externally discharged from the housing 37. The intake port 37a and the discharge port 37b can be connected with an intake pipe and a discharge pipe (not illustrated). When connected with the intake pipe and the discharge pipe, the intake port 37a and the discharge port 37b are each sealed by an O ring (not illustrated) to prevent mixture of outside air into the housing 37. The intake port 37a is connected with a nitrogen gas supply source 43.

The nitrogen gas also flows inside the optical path pipe 5. The optical path pipe 5 is sealed by O rings at a connection part with the laser processing device 4 and at a connection part with the laser apparatus 3.

2.2 Operation

The following describes the operation of the laser processing system 2 with reference to FIGS. 2 and 3. As illustrated in FIG. 2, when the laser processing is performed, the workpiece 41 is set on the table 33 of the XYZ stage 34

(S100). The laser processing control unit 32 sets position data of an initial processing place to the XYZ stage 34 (S110).

The laser processing control unit 32 adjusts the position of the workpiece 41 on the XY plane by controlling the XYZ stage 34 (S120). At S120, the laser processing control unit 32 adjusts the position of the workpiece 41 on the XY plane by controlling the moving amount of the XYZ stage 34 based on coordinate data on the XY plane included in the position data. Accordingly, the position of the workpiece 41 on the XY plane is set.

Subsequently, the laser processing control unit 32 adjusts the position of the workpiece 41 in the Z-axis direction by controlling the XYZ stage 34 so that the transfer position of the transfer image of the pulse laser beam coincides with the surface of the workpiece 41 (S130). Specifically, in the position data, the position of the workpiece 41 in the Z-axis direction is defined so that the transfer position of the transfer image of the pulse laser beam coincides with the surface of the workpiece 41. The transfer position of the transfer image is determined in accordance with, for example, the distance between the transfer mask 47 and the transfer lens 48 and the focal length of the transfer lens 48.

At S130, the laser processing control unit 32 adjusts the position of the workpiece 41 in the Z-axis direction by controlling the moving amount of the XYZ stage 34 based on the position data. Accordingly, relative positioning of the transfer position and the workpiece 41 is performed so that the transfer position and the surface of the workpiece 41 coincide with each other in the Z-axis direction. Since the Z-axis direction is parallel to the optical axis direction of the pulse laser beam incident on the workpiece 41 as described above, positioning in the Z-axis direction corresponds to positioning of the optical axis direction of the pulse laser beam.

After the positioning of the workpiece 41 ends, laser processing is performed (S140). When the next processing place exists (N at S150) after the laser processing at the initial processing place ends, the laser processing control unit 32 sets position data of the next processing place to the XYZ stage 34 (S160). Then, the XYZ stage 34 moves the workpiece 41 to the next processing place (S120 and S130). At the next processing place, the laser processing is performed on the workpiece 41 (S140). When no next processing place exists, the laser processing ends (Y at S150). This procedure is repeated until the laser processing on all processing places ends.

In the present example, the position on the XY plane and the position in the Z-axis direction are both adjusted for each processing place. However, when the position in the Z-axis direction is same between a plurality of processing places, step S130 at which the position in the Z-axis direction is adjusted may be performed for the initial processing place and omitted for the subsequent processing places. In this case, for example, step S130 at which the position in the Z-axis direction is adjusted is first performed after step S110 at which the position data of the initial processing place is set. Thereafter, step S120 is performed to adjust the position on the XY plane for the initial processing place, and then step S140 is performed. Thereafter, step S160 is performed for the next processing place, and then only step S120 is performed with step S130 being omitted, and step S140 is performed.

The laser processing is performed in accordance with a flowchart illustrated in FIG. 3. The laser processing control unit 32 controls the pulse energy so that the pulse laser beam on the surface of the workpiece 41 at the transfer position of the transfer image has desired fluence Ft necessary for the laser processing. Specifically, the laser processing control unit 32 controls the pulse energy incident on the workpiece 41 through control of the target pulse energy Et and the transmittance T of the attenuator 52. In addition, the laser processing control unit 32 transmits the target pulse energy Et to the laser control unit 13 of the laser apparatus 3. Accordingly, the target pulse energy Et is set at the laser control unit 13 (S141).

The fluence Ft is fluence necessary for the laser processing, and is the energy density of the pulse laser beam at the transfer position of the transfer image of the pulse laser beam. When an optical loss at the optical system 36 is negligible, the fluence Ft is defined by Expression (1) below.

$$Ft = M^{-2}(T \cdot Et)/S_{IL} [\text{mJ/cm}^2] \qquad (1)$$

In the expression, M represents the magnification of the transfer optical system, T represents the transmittance of the attenuator, Et represents the pulse energy necessary for the laser processing, and $S_{IL}$, represents laser beam area of the pulse laser beam used in Koehler illumination of the transfer mask 47.

Only light passing through the pinhole as the transfer pattern in the pulse laser beam incident on the transfer mask 47 is incident on the workpiece 41 and contributes to the fluence Ft. Thus, the energy density of the pulse laser beam passing through the transfer pattern per unit area is calculated by dividing the pulse energy T·Et of the pulse laser beam having passed through the attenuator 52 by $S_{IL}$. When the transfer optical system is a reduction optical system as in the present example, the fluence as the energy density increases as the value of the magnification M decreases, in other words, as the size of the image is reduced.

When having received the target pulse energy Et from the laser processing control unit 32, the laser control unit 13 closes the shutter 12 and actuates the charger 23. Then, the laser control unit 13 turns on the switch 24a of the pulse power module 24 by an internal trigger (not illustrated). Accordingly, the master oscillator 10 performs laser oscillation.

The monitor module 11 samples the pulse laser beam output from the master oscillator 10 to measure pulse energy E as an actual value of the pulse energy. The laser control unit 13 controls the charge voltage of the charger 23 so that a difference ΔE between the pulse energy E and the target pulse energy Et approaches to zero. Specifically, the laser control unit 13 controls the charge voltage so that the difference ΔE becomes within an allowable range (S142).

The laser control unit 13 monitors whether the difference ΔE has become within the allowable range (S142). When the difference ΔE has become within the allowable range (Y at S142), the laser control unit 13 transmits, to the laser processing control unit 32, a reception preparation completion signal notifying completion of preparation for reception of the light emission trigger Tr, and opens the shutter 12. Accordingly, the laser apparatus 3 completes the preparation for reception of the light emission trigger Tr (S143).

Having received the reception preparation completion signal, the laser processing control unit 32 sets the transmittance T of the attenuator 52 so that the fluence at the transfer position of the transfer image of the pulse laser beam becomes equal to the fluence Ft necessary for the laser processing (S144). In the present example, since the transfer position coincides with the position of the surface of the workpiece 41 through the positioning of the workpiece 41 in the Z-axis direction (refer to S130 in FIG. 2), the fluence at the transfer position is equal to the fluence of the pulse laser beam at the surface of the workpiece 41. Thus, through the setting of the transmittance T of the attenuator 52, the fluence of the pulse laser beam at the position of the surface of the workpiece 41 is adjusted to the fluence Ft necessary for the laser processing.

When the optical system 36 has no optical loss, Expression (2) below for the transmittance T of the attenuator 52 is obtained from Expression (1) above.

$$T=(Ft/Et)S_{IL} \cdot M^2 \quad (2)$$

As described above, Ft represents the fluence necessary for the laser processing, Et represents the target pulse energy necessary for the laser processing, and $S_{IL}$ represents the laser beam area of the pulse laser beam used in Koehler illumination of the transfer mask 47.

After having set the transmittance T of the attenuator 52, the laser processing control unit 32 transmits the light emission trigger Tr defined by a predetermined repetition frequency f and a predetermined pulse number N to the laser control unit 13 (S145). As a result, in synchronization with the light emission trigger Tr, the pulse laser beam having passed through the beam splitter 11a of the monitor module 11 is output from the laser apparatus 3 and incident on the laser processing device 4.

The pulse laser beam incident on the laser processing device 4 is dimmed at the attenuator 52 via the high reflectance mirror 36a. The pulse laser beam having passed through the attenuator 52 is reflected at the high reflectance mirror 36b and incident on the beam homogenizer 46. The light intensity of the pulse laser beam is spatially homogenized at the beam homogenizer 46, and the pulse laser beam is used in Koehler illumination of the transfer mask 47.

In the pulse laser beam incident on the transfer mask 47, the pulse laser beam having passed through the pinhole is reflected at the high reflectance mirror 36c and incident on the transfer lens 48. The pulse laser beam having passed through the pinhole of the transfer mask 47 is incident on the transfer lens 48. The transfer image of the pinhole of the transfer mask 47, which is reduced in size is transferred onto the surface of the workpiece 41 through the window 42 by the transfer lens 48. The pulse laser beam having passed through the transfer lens 48 is incident on a region of the surface of the workpiece 41 corresponding to the transfer image. This laser irradiation with the pulse laser beam is performed in accordance with the light emission trigger Tr defined by the repetition frequency f and the pulse number N necessary for the laser processing (S145). Through the laser irradiation, the laser processing of forming a hole in the pinhole shape is performed on the workpiece 41.

2.3 Problem

It has been desired to form a hole having a high aspect ratio through the laser processing of forming a hole in the workpiece 41. The hole having a high aspect ratio means an elongated hole in which a processing depth as the depth of the hole is large relative to the diameter of the hole. Specifically, the hole having a high aspect ratio is a hole in which the diameter of the hole is 10 μm to 150 μm approximately and the processing depth is 1.5 mm (1500 μm) approximately or larger. Here, the high aspect ratio is defined to be 1500 μm/150 μm=10 or larger.

Figure 4A:
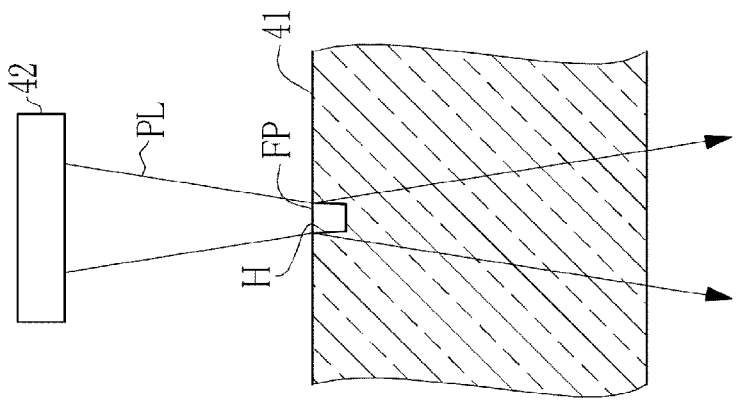
FIGS. 4A and 4B are explanatory diagrams, each illustrating a processing state of the laser processing in the comparative example.

In the laser processing system 2 according to the comparative example illustrated in FIGS. 1 to 3 described above, the accuracy of processing a hole having a high aspect ratio is low. In the laser processing system 2 according to the comparative example, as illustrated in FIG. 4A, positioning of the workpiece 41 is performed while the surface of the workpiece 41 and a transfer position FP of a transfer image of a pulse laser beam PL coincide with each other. Laser irradiation is performed in this state, and the pulse laser beam PL having passed through the window 42 is incident on the workpiece 41.

Figure 4B:
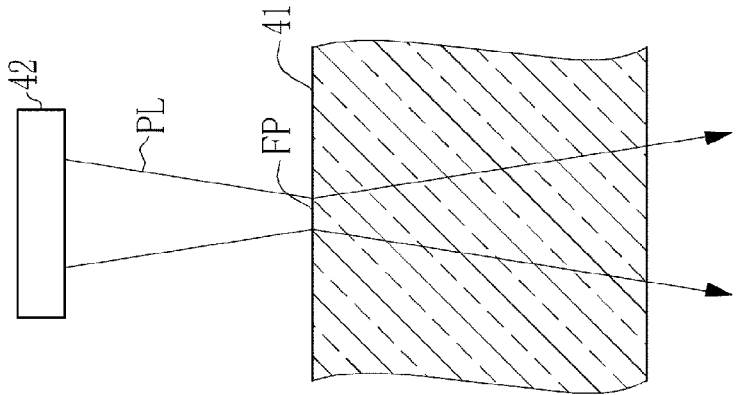

Since the pulse laser beam PL is an ultraviolet ArF laser beam having a central wavelength of 193.4 nm and the workpiece 41 is synthetic quartz glass that is transparent to an ArF laser beam, the pulse laser beam PL passes through the workpiece 41 right after irradiation. As the irradiation with the pulse laser beam PL continues, a defect occurs near the surface of the workpiece 41, and absorption of the pulse laser beam PL starts. As illustrated in FIG. 4B, ablation processing starts at part of the workpiece 41 where the absorption of the pulse laser beam PL starts.

In the laser processing system 2 according to the comparative example, since the transfer position FP of the transfer image of the pulse laser beam PL and the surface of the workpiece 41 coincide with each other as illustrated in FIG. 4A, the fluence Ft is maximum at the surface of the workpiece 41. Thus, as illustrated in FIG. 4B, the ablation processing progresses near the surface of the workpiece 41 where the fluence Ft is high.

However, in a region where the fluence Ft is 15 J/cm$^2$ or smaller, the pulse laser beam having condensed at the transfer position diffuses beyond the transfer position, and thus the fluence Ft decreases as the depth from the surface of the workpiece 41 increases. Thus, with the processing method of the laser processing system 2 of the comparative example, the processing depth of a hole H in a depth direction parallel to the Z-axis direction is 1 mm approximately at most. The processing accuracy is insufficient even when the processing depth of 1 mm or larger is obtained. Specifically, for example, the processing diameter of the hole H at a deep part is significantly smaller than the processing diameter near the surface, the processing diameter of the hole H at a deep part does not satisfy a requested processing diameter, and as a result, the hole has a tapered shape. In this manner, a hole having a high aspect ratio cannot be accurately processed by a laser processing method of performing laser processing on the workpiece 41 transparent to ultraviolet light by using an ultraviolet pulse laser beam.

3. Laser Processing System and Laser Processing Method of First Embodiment 3.1 Configuration FIG. 5 schematically illustrates a configuration of a laser processing system 2A according to a first embodiment. The laser processing system 2A of the first embodiment includes a laser processing device 4A in place of the laser processing device 4 of the laser processing system 2 of the comparative example described with reference to FIG. 1. The following description of the first embodiment is mainly made on any difference from the laser processing system 2 of the comparative example, and any identical component is denoted by an identical reference sign and description thereof is omitted.

Unlike the laser processing device 4 of the comparative example, the laser processing device 4A of the first embodiment includes a laser processing control unit 32A in place of the laser processing control unit 32. The other configuration of the laser processing device 4A is same as that of the laser processing device 4 of the comparative example.

The laser processing control unit 32A is different from the laser processing control unit 32 of the comparative example in control of positioning the transfer position of the pulse laser beam and the workpiece 41 in the Z-axis direction. The laser processing control unit 32A does not adjust the position of the workpiece 41 in the Z-axis direction to a position where the transfer position FP of the pulse laser beam and the surface of the workpiece 41 coincide with each other, but adjusts the transfer position FP of the pulse laser beam to a position inside the surface of the workpiece 41 at a predetermined depth ΔZsf. The other features are same as those of the laser processing control unit 32.

As described above, positioning in the Z-axis direction corresponds to positioning of the optical axis direction of the pulse laser beam. Thus, the laser processing control unit 32A corresponds to a positioning control unit configured to perform relative positioning of the transfer position and the workpiece 41 in the optical axis direction of the pulse laser beam by controlling the XYZ stage 34 as a positioning mechanism.

The laser processing system 2A processes, in the workpiece 41, a hole having a processing diameter of 10 μm to 150 μm inclusive and a high aspect ratio. Thus, the laser processing device 4A irradiates the workpiece 41 with the pulse laser beam having a beam diameter of 10 μm to 150 μm inclusive at the transfer position. The beam diameter of the pulse laser beam at the transfer position is equal to the diameter of the transfer image at the transfer position. In the laser processing device 4A, the size of the transfer pattern of the transfer mask 47 and the magnification M of the transfer lens 48 are set so that the transfer image has a diameter of 10 μm to 150 μm inclusive.

3.2 Operation

Figure 6:
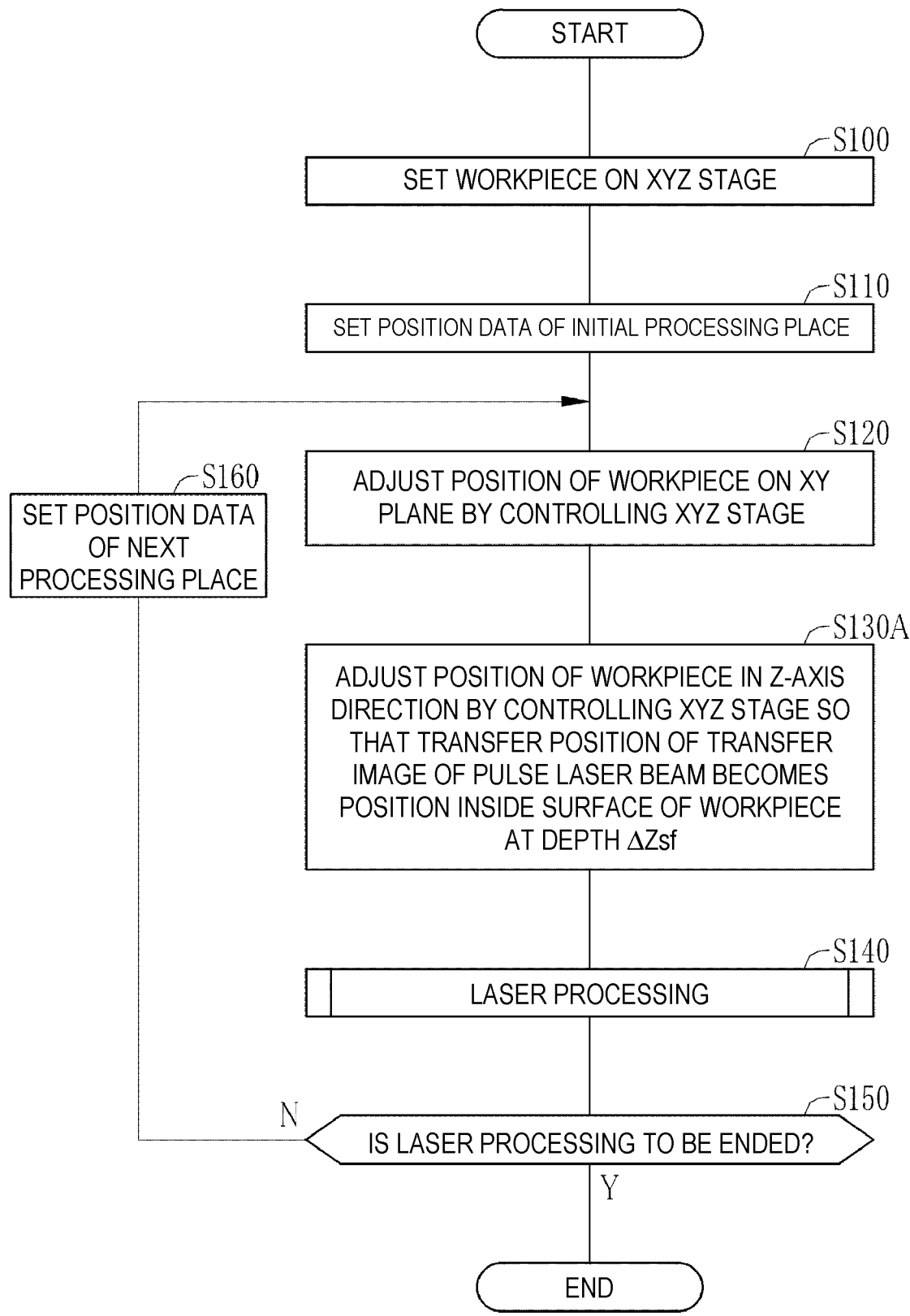
FIG. 6 is a flowchart illustrating a laser processing procedure of the first embodiment.

The following describes the operation of the laser processing system 2A with reference to FIG. 6. A flowchart of FIG. 6 in the first embodiment is different from the flowchart of FIG. 2 in the comparative example in that step S130 is replaced with step S130A, and the other features are same. The laser processing control unit 32A executes the processing at S100 to S120 as in the comparative example, and then executes S130A.

At S130A, the laser processing control unit 32A adjusts the position of the workpiece 41 in the Z-axis direction by controlling the XYZ stage 34 so that the transfer position of the transfer image of the pulse laser beam is set at a position inside the surface of the workpiece 41 at the depth ΔZsf (S130A). Specifically, in the position data, the position of the workpiece 41 in the Z-axis direction is defined so that the transfer position of the transfer image of the pulse laser beam is set at a position inside the surface of the workpiece 41 at the depth ΔZsf. As described above, the transfer position of the transfer image is determined in accordance with, for example, the distance between the transfer mask 47 and the transfer lens 48 and the focal length of the transfer lens 48.

At S130A, the laser processing control unit 32A adjusts the position of the workpiece 41 in the Z-axis direction by controlling the moving amount of the XYZ stage 34 based on the position data. Accordingly, relative positioning of the transfer position and the workpiece 41 is performed so that the transfer position of the transfer image is set at a position inside the surface of the workpiece 41 at the depth ΔZsf in the optical axis direction of the pulse laser beam, which is parallel to the Z-axis direction.

After the positioning of the workpiece 41 ends, laser processing is performed (S140). The processing at S140 to S160 is same as the processing by the laser processing system 2 of the comparative example illustrated in FIG. 2. The content of processing at S140 is same as that of the processing of the comparative example illustrated in FIG. 3.

As complementally described in the comparative example, in the present example as well, when the position in the Z-axis direction is same between a plurality of processing places, step S130A at which the position in the Z-axis direction is adjusted may be performed for the initial processing place and omitted for the subsequent processing places. In this case, for example, step S130A at which the position in the Z-axis direction is adjusted is first performed after step S110 at which the position data is set for the initial processing place. Thereafter, step S120 is performed to adjust the position on the XY plane for the initial processing place, and then step S140 is performed. Then, step S160 is performed for the next processing place, and then only step S120 is performed with step S130A being omitted, and step S140 is performed.

3.3 Effect

Figure 7:
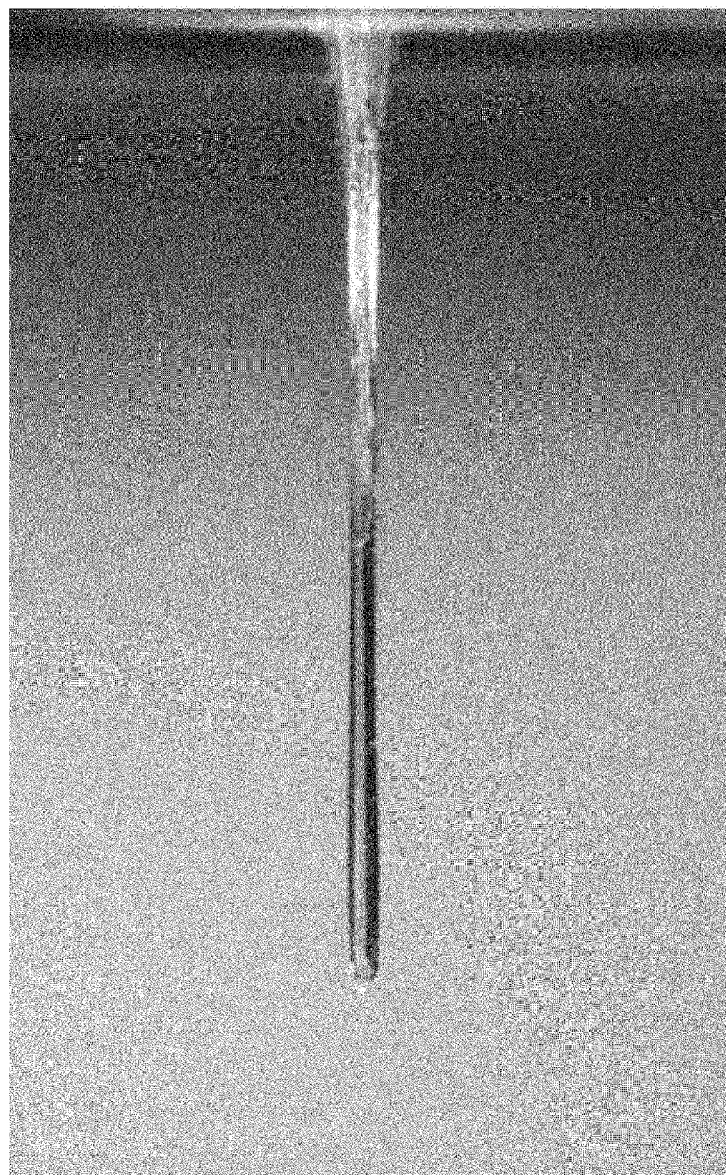
FIG. 7 illustrates a picture of a processing result of laser processing of the first embodiment.

FIG. 7 illustrates a picture of a processing result obtained when laser processing was performed on the workpiece 41 through the procedure of the above-described laser processing method by using the laser processing system 2A of the first embodiment. The workpiece 41 is synthetic quartz glass that is transparent also to visible light, and thus the picture in FIG. 7 was obtained by performing, in the Y-axis direction, image capturing of the state of the hole H of the workpiece 41 after the processing was completed. As observed in the picture in FIG. 7, the hole H elongated in the Z-axis direction and having a high aspect ratio was formed.

Conditions of the processing of the hole H for obtaining a processing result illustrated in FIG. 7 are as follows. The workpiece 41 is synthetic quartz glass having a thickness of 6 mm approximately. The pulse laser beam is an ultraviolet ArF laser beam having a central wavelength of 193.4 nm approximately as described above. The repetition frequency f is 1 kHz, the duration of irradiation with the pulse laser beam is 5 sec, the number of irradiation pulses is 1 kHz×5 sec=5,000. The diameter of the transfer image having a pinhole shape at the transfer position is 100 μm, the depth ΔZsf of the transfer position from the surface of the workpiece 41 is 1 mm, and the fluence Ft is 11.7 J/cm$^2$. With these processing conditions, a hole, at a processing depth ΔZd of 1.7 mm approximately, having diameters of 110 μm, 53 μm, and 45 μm at the surface of the workpiece 41, a middle position, and a deepest part, respectively, and having a high aspect ratio was processed.

In addition, it was observed by experiment that, under the same processing conditions except that the duration of pulse irradiation is increased to 10 seconds to 15 seconds, in other words, the number of irradiation pulses is increased to 10,000 to 15,000, a hole having diameters substantially equal to those described above and having a high aspect ratio can be processed at a processing depth of 3 mm to 4 mm as illustrated in a graph in FIG. 11 to be described later.

Figure 8:
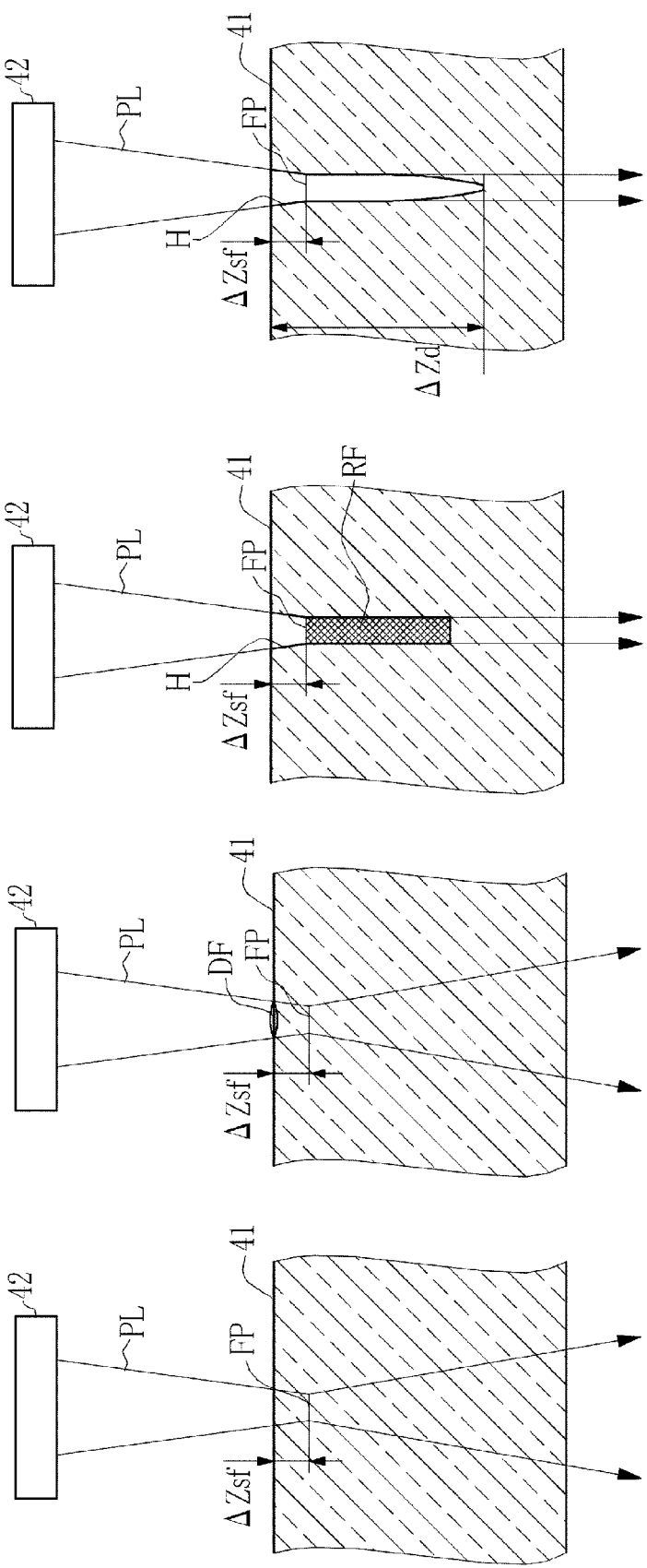
FIGS. 8A, 8B, 8C and 8D are explanatory diagrams illustrating state transition of the workpiece when the laser processing in the first embodiment is provided.

FIGS. 8A to 8D are explanatory diagrams illustrating transition of a state of the workpiece 41 when laser processing is provided on the workpiece 41 by using the laser processing system 2A and the laser processing method of the first embodiment. In the laser processing system 2A according to the first embodiment, as illustrated in FIG. 8A, positioning is performed so that the transfer position FP of the transfer image of the pulse laser beam PL is set at a position inside the surface of the workpiece 41 at the depth ΔZsf. Laser irradiation is performed in this state, and the workpiece 41 is irradiated with the pulse laser beam PL having passed through the window 42.

Since the pulse laser beam PL is ArF laser having a central wavelength of 193.4 nm approximately and the workpiece 41 is synthetic quartz glass that is transparent to ArF laser, the pulse laser beam PL passes through the workpiece 41 right after of irradiation as illustrated in FIG. 8A. As the irradiation with the pulse laser beam PL continues, a defect DF occurs near the surface of the workpiece 41 as illustrated in FIG. 8B, and absorption of the pulse laser beam PL starts.

As the irradiation with the pulse laser beam continues, the rate of absorption of the pulse laser beam increases near the surface of the workpiece 41 where the absorption of the pulse laser beam PL starts, and ablation processing starts as illustrated in FIG. 8C. After the start of the ablation processing, part of the pulse laser beam is not absorbed but passes through the inside of the workpiece 41. At a certain timing after the start of the ablation processing, this transmission light of the pulse laser beam becomes self-focused without diffusing inside the workpiece 41 and proceeds in a depth direction parallel to the Z-axis direction as illustrated in FIG. 8C. Then, the self-focused pulse laser beam progresses the ablation processing in the depth direction. Accordingly, the hole H having such a high aspect ratio that the hole H has a diameter of 10 μm to 150 μm approximately and the processing depth $\Delta Zd$ is 1.5 mm or larger is processed as illustrated in FIG. 8D.

Such a processing result of formation of the hole H having a high aspect ratio suggests that the pulse laser beam is self-focused inside the workpiece 41 for some reason as illustrated in FIG. 8C. It is thought that the self-focusing occurs because reforming occurs to the optical path through which the pulse laser beam passes inside the workpiece 41, and a reforming layer RF elongated in the depth direction is generated as illustrated in FIG. 8C.

One hypothesis is such that the self-focusing occurs because the refractive index is increased at the reforming layer RF as compared to the other part due to transmission of the pulse laser beam. Another hypothesis is such that the self-focusing occurs because the pulse laser beam travels in the depth direction through repetition of Fresnel reflection at the inner wall surface of the hole H, which is the boundary between the reforming layer RF and a non-reforming part, as if light is propagating inside an optical fiber.

Irrespective of these reasons of the self-focusing, it was observed that a hole having a high aspect ratio was accurately processed when the laser processing was performed on the workpiece 41 under the above-described processing conditions.

3.4 Preferable Processing Conditions

When an ultraviolet pulse laser beam is used, it is desired to use a pulse laser beam having a pulse width in the order of nanoseconds from 1 ns to 100 ns at full width at half maximum. This is because the pulse width depends on performance of the laser apparatus 3, and it is currently difficult to manufacture the laser apparatus 3 capable of outputting a pulse laser beam having a pulse width in the order of picoseconds and high pulse energy as an ultraviolet pulse laser beam. When an ultraviolet pulse laser beam in the order of nanoseconds is used as in the present example, it is possible to use the laser apparatus 3 that is currently easily available.

The pulse width is preferably 1 ns to 100 ns at full width at half maximum, more preferably 10 ns to 20 ns. It is preferable to use a laser apparatus capable of outputting a pulse laser beam having such a pulse width as the laser apparatus 3.

The following processing conditions are suitable when such an ultraviolet pulse laser beam in the order of nanoseconds is used to perform laser processing of forming a hole having a high aspect ratio on the workpiece 41 made of a transparent material such as synthetic quartz glass that is transparent to ultraviolet light.

Figure 9:
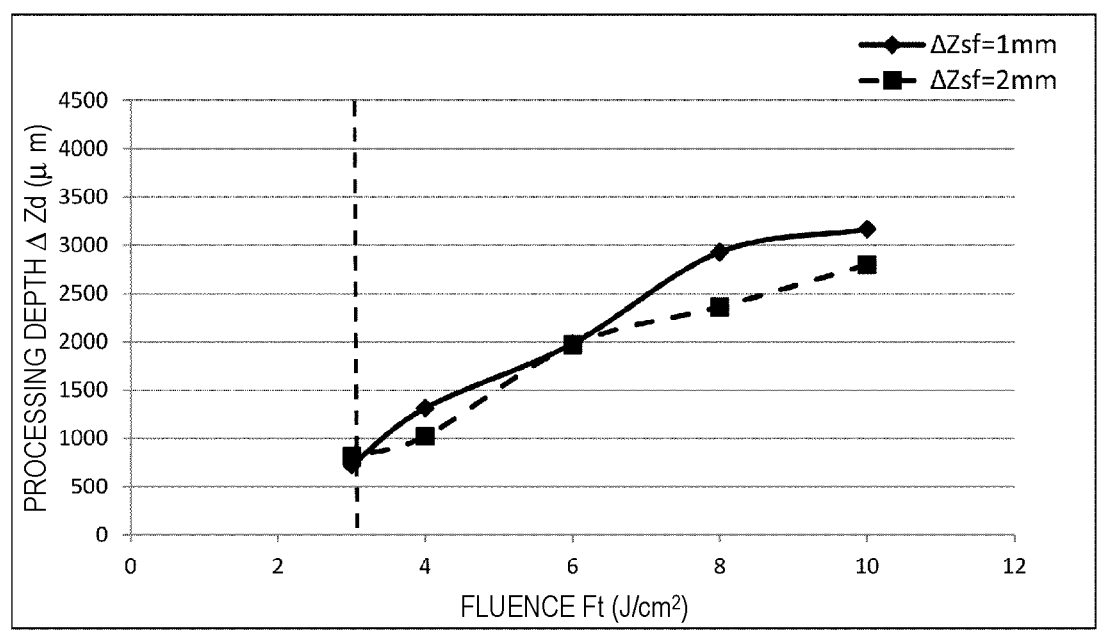
FIG. 9 is a graph illustrating relation between a fluence and a processing depth $\Delta Zd$, which was obtained by experiment in the first embodiment.

FIG. 9 is a graph illustrating the relation between the fluence Ft at the transfer position and the processing depth $\Delta Zd$. A curve illustrated with rhombic plot points and a solid line is a graph when the depth $\Delta Zsf$ at the transfer position is 1 mm, and a curve illustrated with rectangular plot points and a dashed line is a graph when the depth $\Delta Zsf$ at the transfer position is 2 mm. In each graph, the processing depth $\Delta Zd$ increases as the fluence Ft increases.

Although no data in which the fluence Ft is lower than 3 J/cm$^2$ is illustrated in the graphs in FIG. 9, it was observed, when the fluence Ft at the transfer position is lower than 3 J/cm$^2$, the processing depth $\Delta Zd$ is small and a hole having a high aspect ratio is unlikely to be processed. This is thought to be because, when the fluence Ft is lower than 3 J/cm$^2$, ablation processing is unlikely to occur due to too small energy and processing is incomplete.

Figure 10:
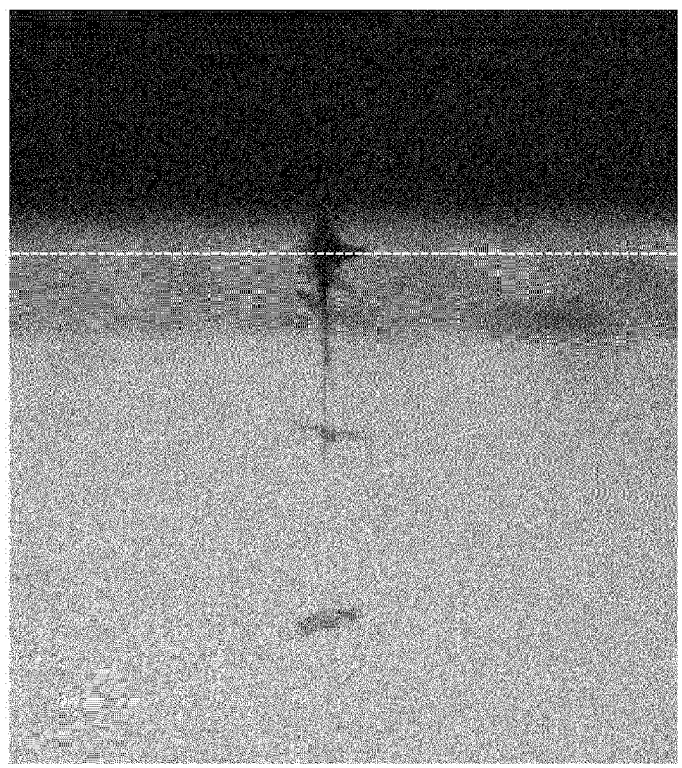
FIG. 10 illustrates a picture of a processing result when the fluence is insufficient.

FIG. 10 illustrates a picture of a processing result when laser processing was performed on the workpiece 41 with the fluence Ft set to be 2 J/cm$^2$. Image capturing was performed in the Y-axis direction as in FIG. 7. Processing conditions were same as those for the processing result in FIG. 7 except for the fluence Ft. In FIG. 10, a white dashed line extending in a lateral direction indicates the position of the surface of the workpiece 41. As observed from FIG. 10, when the fluence Ft was 2 J/cm$^2$, a hole was slightly formed on the surface of the workpiece 41 but processing made no progress in the depth direction, and the hole processing is incomplete.

Figure 11:
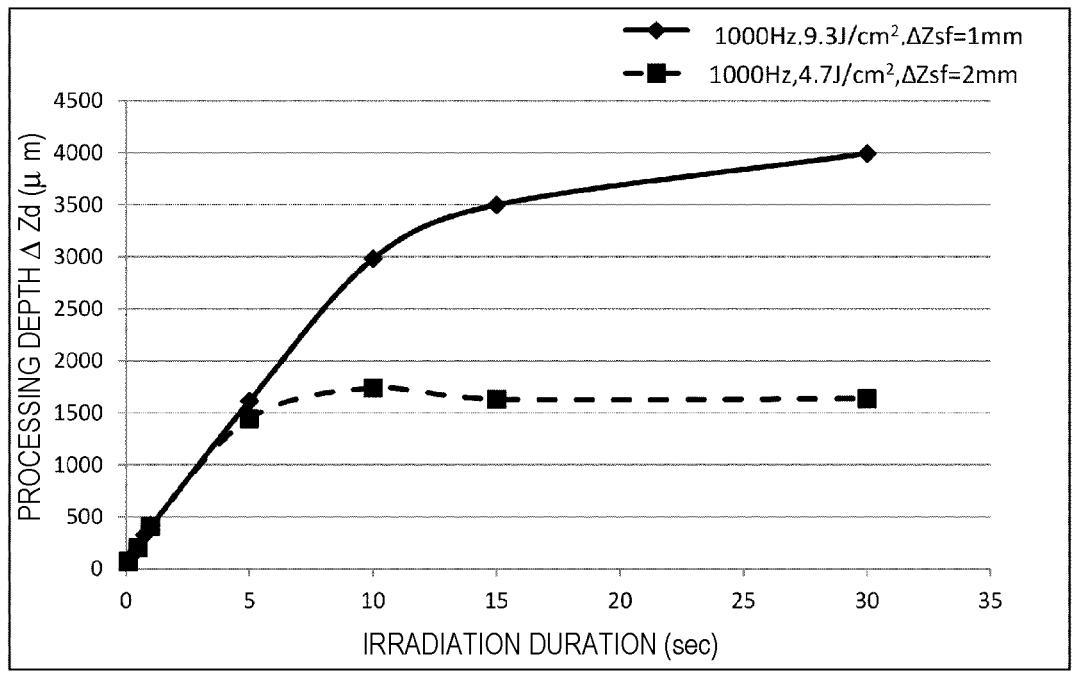
FIG. 11 is a graph illustrating relation between the duration of irradiation and the processing depth $\Delta Zd$, which was obtained by experiment in the first embodiment.

FIG. 11 is a graph illustrating relation between the duration of irradiation and the processing depth $\Delta Zd$. A curve illustrated with rhombic plot points and a solid line is a graph when the fluence Ft is 9.3 J/cm$^2$ and the depth $\Delta Zsf$ at the transfer position is 1 mm. A curve illustrated with rectangular plot points and a dashed line is a graph when the fluence Ft is 4.7 J/cm$^2$ and the depth $\Delta Zsf$ at the transfer position is 2 mm.

In each graph, the repetition frequency f is 1 kHz. The duration of irradiation on the horizontal axis in FIG. 11 is in units of seconds (sec), and thus the number of irradiation pulses is obtained by the repetition frequency f×the duration of irradiation (seconds). For example, when the duration of irradiation is 5 seconds, the number of irradiation pulses is 5,000.

In FIG. 11, comparison between the graph with a solid line and the graph with a dashed line for a saturation point where the processing depth $\Delta Zd$ is saturated indicates that the saturation point is at 10 sec approximately in the graph with a dashed line for which the fluence Ft is relatively low but the saturation point is at 30 sec approximately in the graph with a solid line for which the fluence Ft is relatively high. The graphs in FIG. 11 indicate that, as the fluence Ft is higher, saturation is slower for the duration of irradiation and the processing depth $\Delta Zd$ is deeper.

In FIG. 11, when it is assumed that the duration of irradiation is 3 seconds approximately, in other words, the repetition frequency f is 1 kHz, the graph with a solid line and the graph with a dashed line overlap with each other until the number of irradiation pulses becomes equal to 3,000 approximately. Thus, in this range, the processing depth $\Delta Zd$ does not depend on the fluence Ft. Accordingly, it is thought that the self-focusing of a pulse laser beam does not start until the number of irradiation pulses becomes equal to 3,000 approximately. Thus, the number of irradiation pulses is preferably 3,000 or larger. The upper limit of the number of irradiation pulses is preferably 35,000 with which the saturation point of the processing depth $\Delta Zd$ is reached. Although FIG. 11 illustrates results when the repetition frequency f is 1 kHz, the number of irradiation pulses is substantially same for the repetition frequency f of 100 Hz at the saturation point where the processing depth $\Delta Zd$ is saturated. Thus, the relation between the number of irradiation pulses and the processing depth $\Delta Zd$ does not largely depend on the repetition frequency f.

Figure 12:
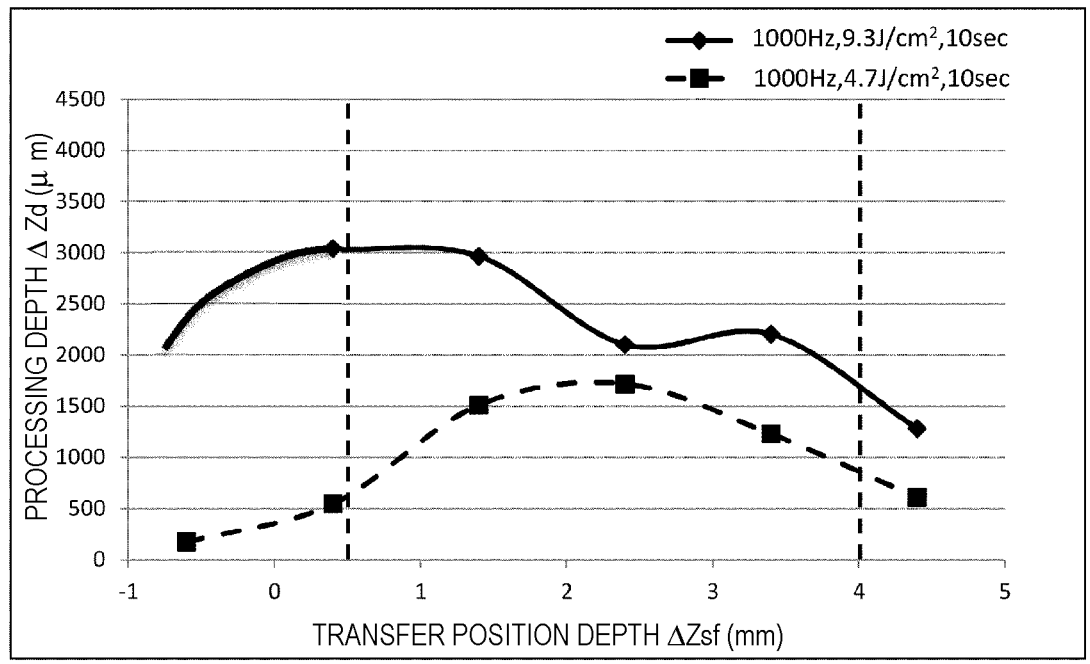
FIG. 12 is a graph illustrating relation between the depth $\Delta Zsf$ of the transfer position and the processing depth $\Delta Zd$, which was obtained by experiment in the first embodiment.

FIG. 12 is a graph illustrating relation between the depth $\Delta Zsf$ at the transfer position and the processing depth $\Delta Zd$. In FIG. 12, a curve illustrated with rhombic plot points and a solid line is a graph when the fluence Ft is 9.3 J/cm$^2$ like the graph illustrated with a solid line in FIG. 11, and a curve illustrated with rectangular plot points and a dashed line is a graph when the fluence Ft is 4.7 J/cm$^2$ like the graph illustrated with a dashed line in FIG. 11. In each graph, the repetition frequency f is 1 kHz, and the duration of irradiation is 10 seconds.

In FIG. 12, the graph with a dashed line for which the fluence Ft is relatively low indicates that the processing depth $\Delta Zd$ increases as the depth $\Delta Zsf$ at the transfer position increases until the depth $\Delta Zsf$ at the transfer position becomes equal to 2.5 mm approximately. This is thought to be because, up to 2.5 mm approximately, the transfer position at which the fluence Ft is maximum becomes deeper from the surface of the workpiece 41, and thus the energy of the pulse laser beam at a deep part of the workpiece 41 increases and the processing progresses in the depth direction.

Beyond 2.5 mm approximately, the processing depth $\Delta Zd$ tends to monotonically decrease as the depth $\Delta Zsf$ at the transfer position increases, and the processing depth $\Delta Zd$ becomes significantly smaller than 1 mm when the depth $\Delta Zsf$ exceeds 4 mm. This is thought to be because, when the depth $\Delta Zsf$ exceeds 2.5 mm approximately, the fluence Ft is insufficient near the surface of the workpiece 41 and the ablation processing does not progress near the surface, and as a result, the ablation processing does not progress in the depth direction.

In FIG. 12, the graph with a solid line for which the fluence Ft is relatively high indicates that the processing depth $\Delta Zd$ is 2 mm or larger when the depth $\Delta Zsf$ at the transfer position is within a range from 0.5 mm to 3.5 mm approximately. This is thought to be because, in this range, the transfer position at which the fluence Ft is maximum is deeper from the surface of the workpiece 41, and thus the energy of the pulse laser beam at a deep part of the workpiece 41 increases and the ablation processing progresses in the depth direction.

When the depth $\Delta Zsf$ at the transfer position exceeds 3.5 mm approximately, the depth $\Delta Zsf$ at the transfer position tends to monotonically decrease. When the depth $\Delta Zsf$ exceeds 4 mm, the processing depth $\Delta Zd$ becomes closer to 1 mm.

When the depth $\Delta Zsf$ at the transfer position is within a range from 0 mm to 0.5 mm approximately, the processing depth $\Delta Zd$ of 2 mm or larger is ensured. However, in this range, although the processing depth $\Delta Zd$ is ensured, the hole often has a tapered shape in which the processing diameter at a deep part is significantly smaller than the processing diameter near the surface, and thus the processing accuracy is low. Thus, the depth $\Delta Zsf$ at the transfer position is preferably within a range from 0.5 mm to 4 mm inclusive.

Comparison of the peak value of the processing depth $\Delta Zd$ between the graph with a solid line and the graph with a dashed line in FIG. 12 indicates that the graph with a dashed line for which the fluence Ft is relatively low has the peak value where the depth $\Delta Zsf$ at the transfer position is larger. In other words, in the graph with a solid line for which the fluence Ft is relatively high, the depth $\Delta Zsf$ at the transfer position where the processing depth $\Delta Zd$ has the peak value is shifted nearer the surface of the workpiece 41 as compared to the graph with a dashed line for which the fluence Ft is relatively low.

As illustrated in FIG. 9, the lower limit of the fluence Ft necessary for laser processing on the workpiece 41 is 3 J/cm$^2$. When these experiment results illustrated in FIGS. 9 and 12 are taken into consideration, it is thought that the depth $\Delta Zsf$ at the transfer position is particularly preferable to be within a range from 0.5 mm to 4 mm inclusive for the fluence Ft of 3 J/cm$^2$ to 15 J/cm$^2$.

3.5 Other

When the beam homogenizer 46 is used as in the present example, the light intensity of the pulse laser beam is spatially homogenized, and the transfer mask 47 is irradiated with the pulse laser beam. Thus, in a range where the transfer mask 47 is irradiated with the pulse laser beam, the fluence of the transfer image of the pulse laser beam formed by the transfer pattern is stable irrespective of the position of the transfer pattern formed on the transfer mask 47.

A transfer mask on which a plurality of transfer patterns are formed, such as a transfer mask on which a plurality of pinholes are formed may be used as the transfer mask 47. When such a transfer mask 47 is used, a plurality of holes can be simultaneously processed. In this case, it is preferable to use, as the transfer lens 48, a transfer optical system that is telecentric at least on a processing side. This is because, with the telecentric optical system, the optical axes of pulse laser beams passing through a plurality of transfer patterns are parallel to each other, and thus each pulse laser beam is incident on the workpiece 41 in orthogonal to the surface of the workpiece 41. As a result, a plurality of holes each having a central axis substantially orthogonal to the surface of the workpiece 41 can be formed.

In the present example, relative positioning of the transfer position of the pulse laser beam and the workpiece 41 is performed by moving the workpiece 41 through control of the XYZ stage 34. Instead of moving the workpiece 41 in this manner, the relative positioning may be performed by moving the transfer mask 47 in the optical axis direction of the pulse laser beam. Specifically, the movement of the transfer mask 47 in the optical axis direction of the pulse laser beam is equivalent to change of the position of the transfer image transferred by the transfer lens 48 on the object side relative to the transfer lens 48, and thus the transfer position of the transfer image is changed in the optical axis direction. Accordingly, the relative positioning of the transfer position of the pulse laser beam and the workpiece 41 can be performed. In this case, the size of the transfer image is changed as the transfer mask 47 is moved relative to the transfer lens 48 in the optical axis direction. Such change of the diameter of the transfer image attributable to the movement of the transfer mask 47 may be prevented by changing the diameter of each pinhole of the transfer mask 47.

When the transfer image in a pinhole shape is transferred onto the workpiece 41 by using the transfer optical system as in the present example, change of the beam diameter is reduced as compared to a case in which the pulse laser beam is simply condensed and incident on the workpiece 41 as in a second embodiment to be described later. This is an advantage. The mode and beam diameter of the pulse laser beam output from the laser apparatus 3 change depending on a state of the optical resonator of the laser apparatus 3 or the like. However, when the transfer optical system is used, not the pulse laser beam is directly incident on the workpiece 41, but the pinhole-shaped transfer image of the pulse laser beam is formed through the transfer mask 47 and transferred onto the workpiece 41. This prevents change of the beam diameter attributable to mode change of the pulse laser beam.

In the present example, for the laser apparatus 3, an ArF excimer laser apparatus that uses ArF laser gas as a laser medium and outputs a pulse laser beam having a central wavelength of 193.4 nm approximately is described as an example, but the laser apparatus 3 may be another laser apparatus. For the laser apparatus 3, a KrF excimer laser apparatus that uses KrF laser gas as a laser medium and outputs a pulse laser beam having a central wavelength of 248.4 nm approximately may be used. When, for the workpiece 41, synthetic quartz glass is used, the range of the central wavelength of the pulse laser beam is preferably from 157.6 nm approximately, which is the central wavelength of $F_2$ laser, to 248.4 nm, which is the central wavelength of KrF laser.

The workpiece 41 is synthetic quartz glass in the above example, but is not limited thereto. The workpiece 41 may be any transparent material that is transparent to an ultraviolet pulse laser beam. Examples of the transparent material that is transparent to an ultraviolet pulse laser beam include $MgF_2$ crystal, $CaF_2$ crystal, and sapphire.

Figure 13:
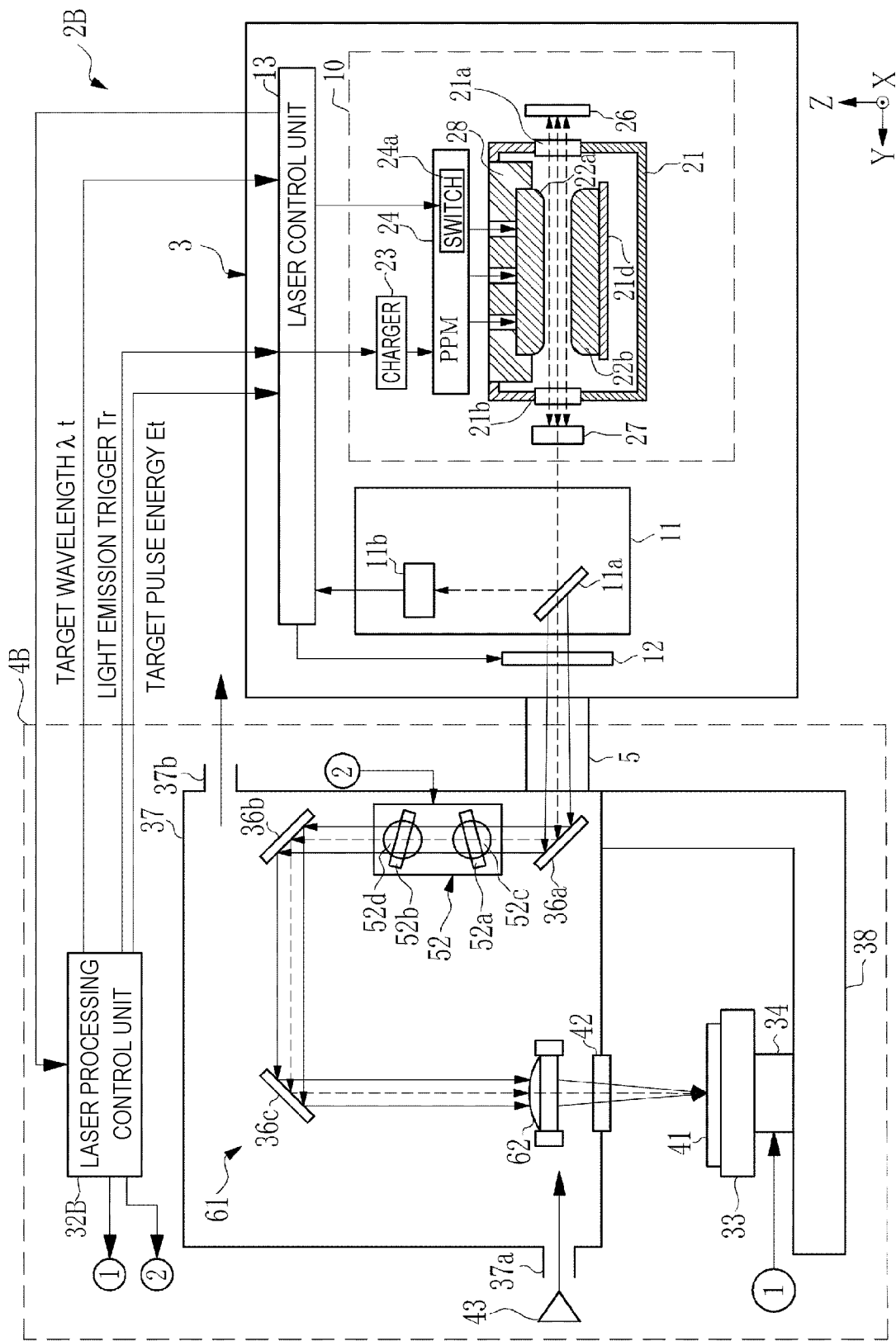
FIG. 13 schematically illustrates a configuration of a laser processing system of a second embodiment.

4. Laser Processing System and Laser Processing Method of Second Embodiment 4.1 Configuration FIG. 13 illustrates a laser processing system 2B of the second embodiment. As illustrated in FIG. 13, the laser processing system 2B of the second embodiment includes the laser apparatus 3 and a laser processing device 4B. The laser apparatus 3 is same as that of the first embodiment. The laser processing device 4B includes an optical system 61 in place of the optical system 36 of the laser processing device 4A of the first embodiment. The optical system 61 does not include the transfer mask 47 nor the transfer lens 48 unlike the optical system 36 of the first embodiment, but includes a condensation optical system configured to directly condense a pulse laser beam output from the laser apparatus 3 and having Gaussian distribution and to emit the pulse laser beam to the workpiece 41.

A laser processing control unit 32B performs relative positioning of the beam waist position of the pulse laser beam and the workpiece 41 instead of performing relative positioning of the transfer position of the pulse laser beam and the workpiece 41 like the laser processing control unit 32A of the first embodiment. The other configuration of the laser processing system 2B is same as that of the laser processing system 2A of the first embodiment, and thus the following description will be mainly made on any difference.

The optical system 61 includes the high reflectance mirrors 36a to 36c, the attenuator 52, and a light condensation lens 62. The high reflectance mirrors 36a to 36c and the attenuator 52 are same as those of the optical system 36 of the first embodiment. The high reflectance mirror 36c reflects the pulse laser beam toward the light condensation lens 62.

The light condensation lens 62 is disposed to condense the pulse laser beam incident thereon onto the workpiece 41 through the window 42.

Similarly to the laser processing system 2A of the first embodiment, the laser processing system 2B of the second embodiment processes a hole having a processing diameter of 10 μm to 150 μm inclusive and a high aspect ratio in the workpiece 41. Thus, the laser processing system 2B irradiates the workpiece 41 with the pulse laser beam having a beam diameter of 10 μm to 150 μm inclusive at the beam waist position. The beam diameter of the pulse laser beam at the beam waist position is equal to a condensation diameter D to be described later at the beam waist position of the pulse laser beam.

In a case of the laser processing system 2B, unlike the laser processing system 2A, the pulse laser beam having Gaussian distribution is emitted onto the workpiece 41 without conversion into the transfer image. Thus, the beam diameter of the pulse laser beam is determined by specifications of the laser apparatus 3.

4.2 Operation

Figure 14:
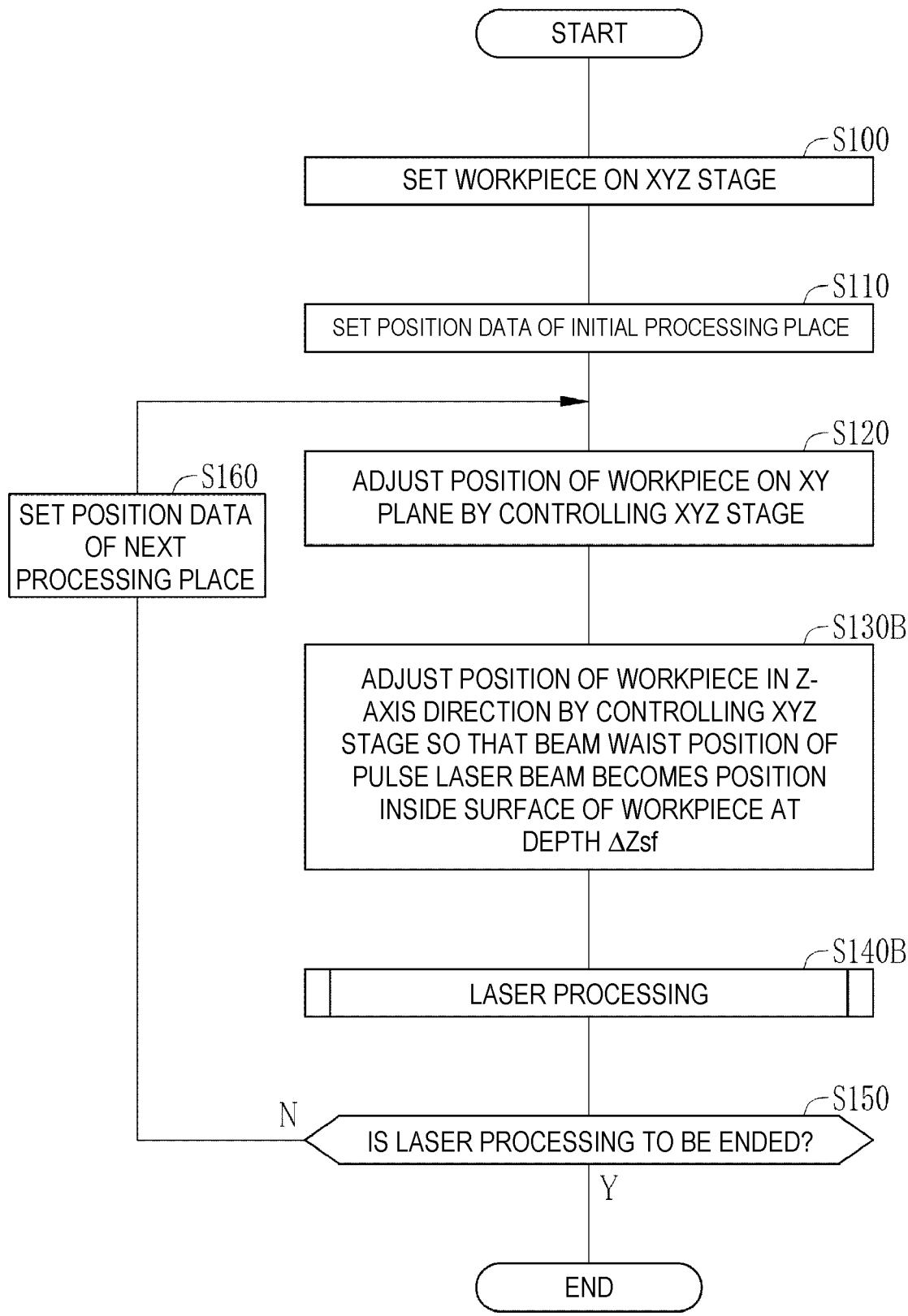
FIG. 14 is a flowchart illustrating a laser processing procedure of the second embodiment.
Figure 15:
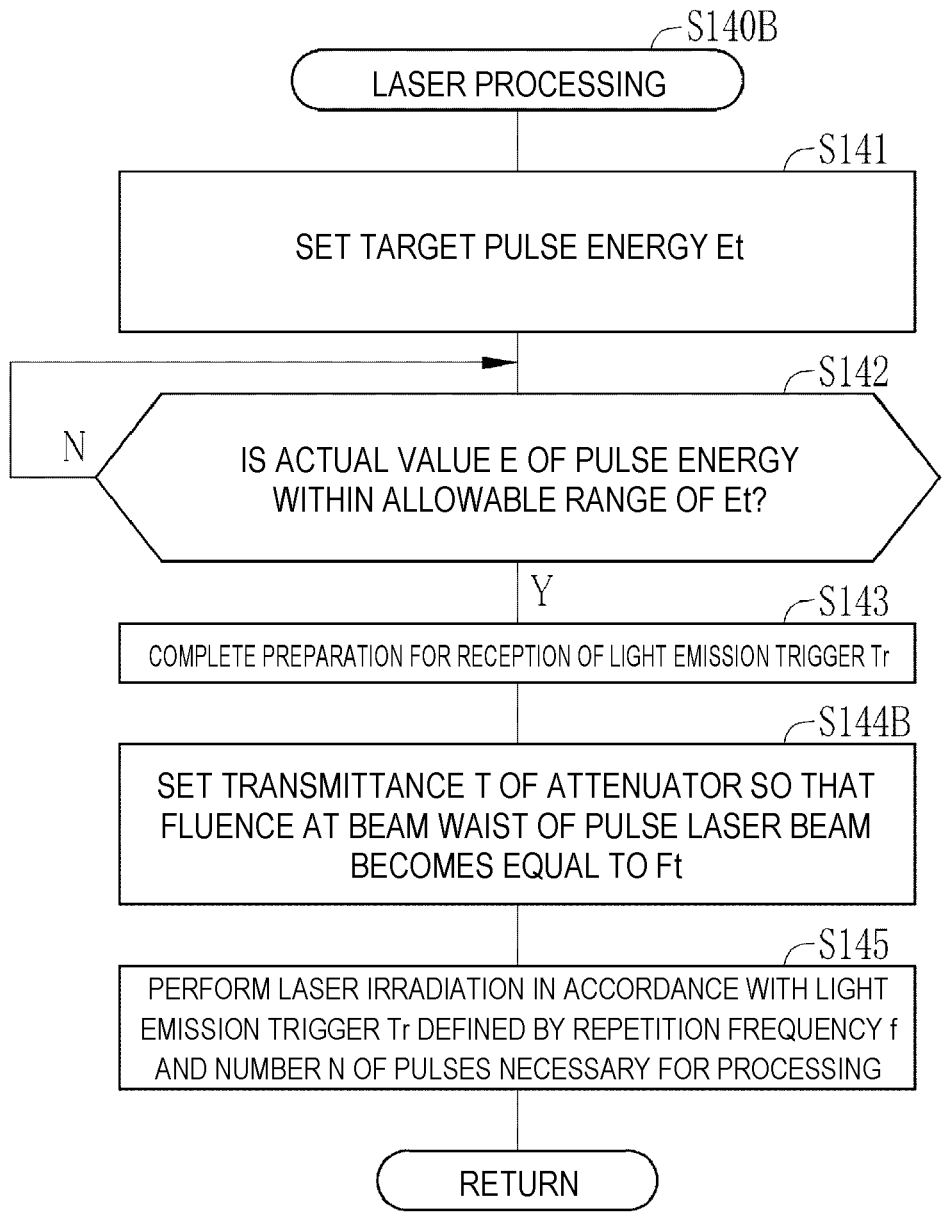
FIG. 15 is a flowchart illustrating the processing procedure of laser processing of the second embodiment.

The following describes an operation of the laser processing system 2B with reference to FIGS. 14 and 15. A flowchart of FIG. 14 in the second embodiment is different from the flowchart of FIG. 6 in the first embodiment in that step S130A is replaced with step S130B and step S140 is replaced with S140B, and the other features are same. The laser processing control unit 32B executes S100 to S120 and then executes S130B.

At S130B, the laser processing control unit 32B adjusts the position of the workpiece 41 in the Z-axis direction by controlling the XYZ stage 34 so that the beam waist position of the pulse laser beam is set at a position inside the surface of the workpiece 41 at the depth ΔZsf (S130B). Specifically, in the position data, the position of the workpiece 41 in the Z-axis direction is defined so that the beam waist position of the pulse laser beam is set at a position inside the surface of the workpiece 41 at the depth ΔZsf.

At S130B, the laser processing control unit 32B adjusts the position of the workpiece 41 in the Z-axis direction by controlling the moving amount of the XYZ stage 34 based on the position data. Accordingly, relative positioning of the workpiece 41 and the beam waist position is performed so that the beam waist position is set at a position inside the surface of the workpiece 41 at the depth ΔZsf in the optical axis direction of the pulse laser beam, which is parallel to the Z-axis direction.

After the positioning of the workpiece 41 ends, laser processing is performed (S140B). Similarly to the first embodiment, the processing at S150 to S160 following the laser processing at S140B is same as the processing by the laser processing system 2 according to the comparative example illustrated in FIG. 2.

FIG. 15 is a flowchart of S140B at which the laser processing is performed. The processing at S140B is basically same as that in the flowchart according to the comparative example in FIG. 3 except that processing at S144B is executed in place of S144. In the second embodiment, relative positioning of the beam waist position of the pulse laser beam and the workpiece 41 is performed. Thus, the transmittance T of the attenuator 52 at S144B is set so that the fluence at the beam waist of the pulse laser beam is Ft.

The fluence Ft in the second embodiment is fluence necessary for the laser processing, and is the energy density of the pulse laser beam at the beam waist position of the pulse laser beam. When an optical loss at the optical system 36 is negligible, the fluence Ft is defined by Expression (3) below.

$$Ft = Et \cdot T/S \, [\text{mJ/cm}^2] \tag{3}$$

When S represents irradiation area and D represents a condensation diameter at the beam waist position of the pulse laser beam, the irradiation area is given by $S=\pi(D/2)^2$ [cm$^2$]. The condensation diameter D is equal to 1/e$^2$ full width, and the 1/e$^2$ full width is a diameter at a position where the light intensity is 1/e$^2$ of the peak value. In the expression, T represents the transmittance of the attenuator 52.

Thus, when the optical system 36 has no optical loss, the transmittance T of the attenuator 52 of the second embodiment is calculated based on Expression (4) below obtained from Expression (3) above.

$$T=\pi(D/2)^2(Ft/Et) \quad (4)$$

In the second embodiment, processing conditions such as the wavelength and pulse width of the pulse laser beam, the range of the fluence Ft, the range of ΔZsf, and the number of irradiation pulses are same as those in the first embodiment.

4.3 Effect

Similarly to the transfer position in the first embodiment, in the second embodiment as well, the beam waist position is a position where the fluence of an emitted pulse laser beam is highest. Thus, similarly to the first embodiment, a hole having a high aspect ratio can be accurately processed by setting the beam waist position to be a position inside the surface of the workpiece 41 at the depth ΔZsf.

4.4 Modification of Laser Processing Device

Figure 16:
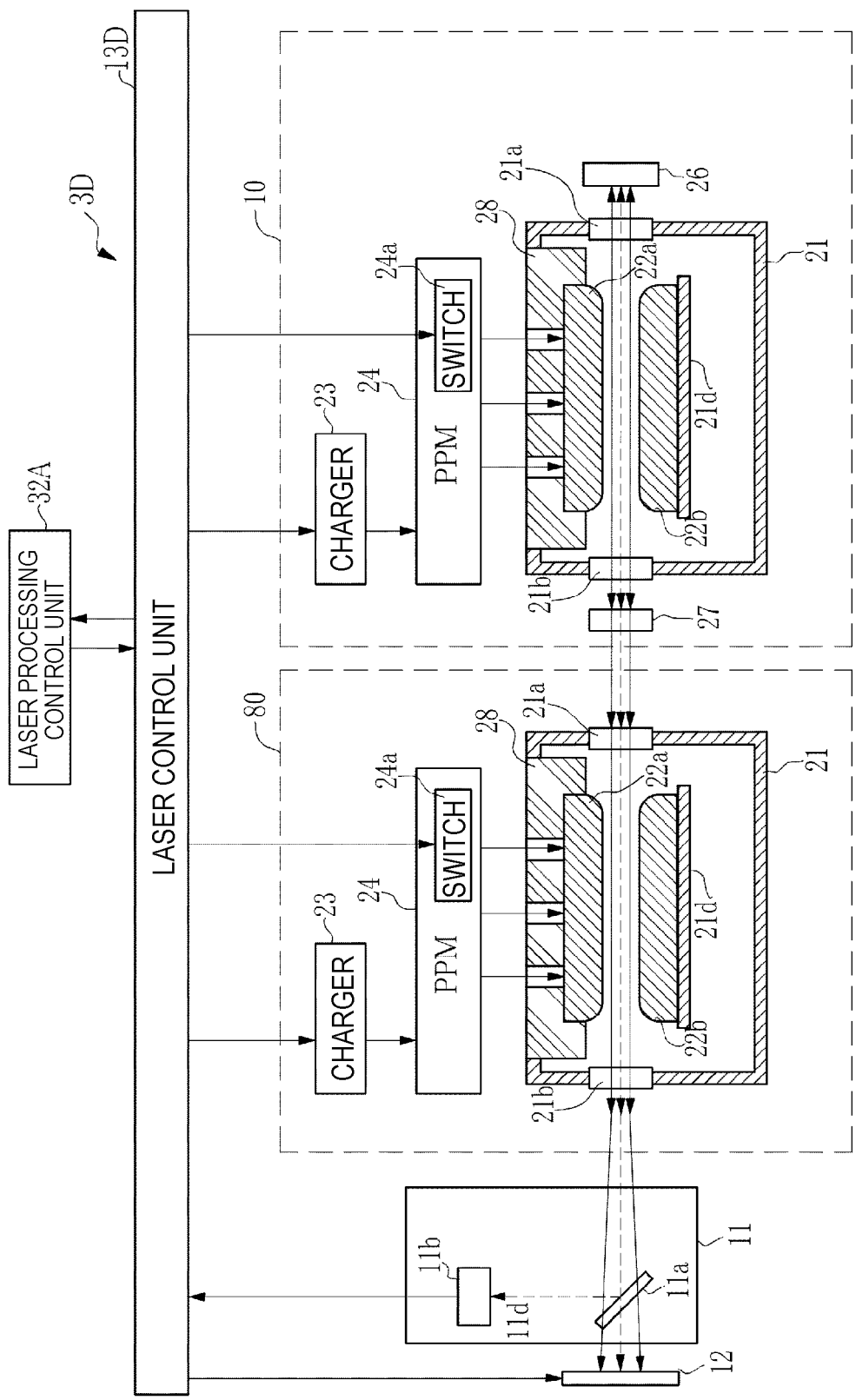
FIG. 16 illustrates a modification of a laser processing device of the second embodiment.

A laser processing device 4C illustrated in FIG. 16 is a modification of the laser processing device 4B of the second embodiment illustrated in FIG. 13. The laser processing device 4C includes an optical system 71 in place of the optical system 61 of the laser processing device 4B. The laser processing device 4C further includes a laser processing control unit 32C in place of the laser processing control unit 32B. The other configuration is same. The following description will be mainly made on any difference.

The optical system 71 includes a wavefront adjuster 72 in addition to the configuration of the optical system 61. The wavefront adjuster 72 includes a concave lens 72a, a convex lens 72b, and a one-axis stage 72c. The one-axis stage 72c holds the concave lens 72a and moves the concave lens 72a in the optical axis direction to adjust the interval between the concave lens 72a and the convex lens 72b. The concave lens 72a and the convex lens 72b are disposed on the optical path of the pulse laser beam between the high reflectance mirror 36c and the light condensation lens 62. The pulse laser beam reflected at the high reflectance mirror 36c is incident on the light condensation lens 62 through the concave lens 72a and the convex lens 72b.

The beam waist position of the pulse laser beam incident on the workpiece 41 can be changed by adjusting the interval between the concave lens 72a and the convex lens 72b.

The laser processing control unit 32C adjusts the position of the workpiece 41 on the XY plane by controlling the XYZ stage 34. As for the relative positions of the beam waist position of the pulse laser beam and the workpiece 41 in the Z-axis direction, the beam waist position in the Z-axis direction is adjusted by controlling the one-axis stage 72c of the wavefront adjuster 72 instead of moving the workpiece 41 by the XYZ stage 34. Specifically, the laser processing control unit 32C can change the wavefront of the pulse laser beam by adjusting the interval between the concave lens 72a and the convex lens 72b through control of the one-axis stage 72c. The wavefront of the pulse laser beam is controlled to adjust the beam waist position so that the beam waist position of the pulse laser beam is set at a position inside the surface of the workpiece 41 at the depth ΔZsf.

5. Modifications of Laser Apparatus

In each above-described embodiment, the laser apparatus may be modified in various kinds of manners. For example, for the laser apparatus, laser apparatuses illustrated in FIGS. 17 and 18 may be used.

5.1 Modification 1

Figure 17:
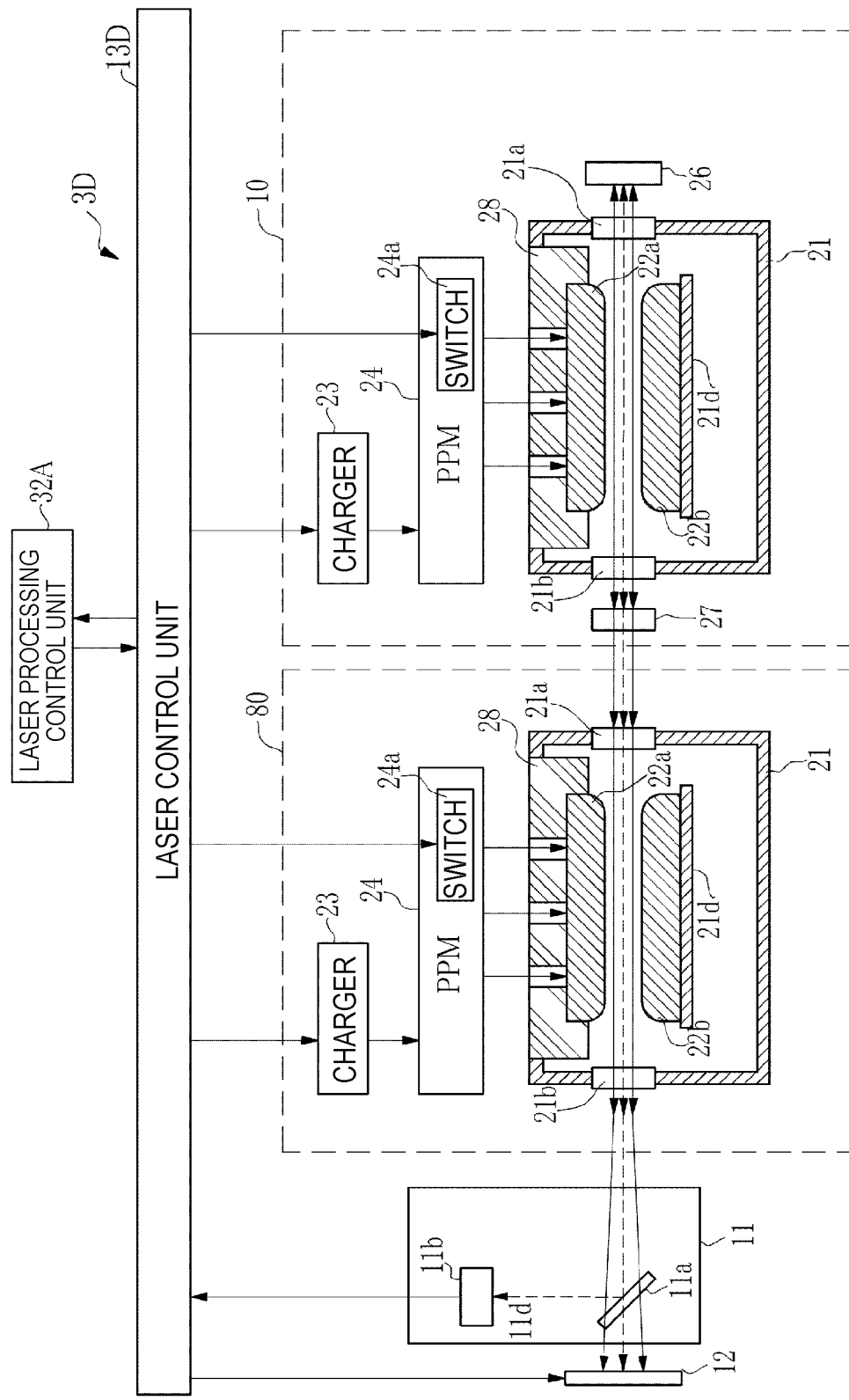
FIG. 17 illustrates Modification 1 of a laser apparatus.

A laser apparatus 3D of Modification 1 illustrated in FIG. 17 includes an amplifier 80 in addition to the configuration of the laser apparatus 3 of the first embodiment, and the other configuration is substantially same as that of the first embodiment. The amplifier 80 is disposed on the optical path of the pulse laser beam between the master oscillator 10 and the monitor module 11. The amplifier 80 amplifies the energy of the pulse laser beam output from the master oscillator 10.

The amplifier 80 has a basic configuration same as that of the master oscillator 10 and includes the laser chamber 21, the charger 23, and the pulse power module (PPM) 24, similarly to the master oscillator 10.

When having received data of the target pulse energy Et from the laser processing control unit 32A, a laser control unit 13D controls the pulse energy by controlling the charge voltage of the charger 23.

When having received the light emission trigger Tr from the laser processing control unit 32A, the laser control unit 13D causes the master oscillator 10 to perform laser oscillation. In addition, the laser control unit 13D controls the amplifier 80 to actuate in synchronization with the master oscillator 10. The laser control unit 13D turns on the switch 24a of the pulse power module 24 of the amplifier 80 so that electric discharge occurs when the pulse laser beam output from the master oscillator 10 is incident in an electric discharge space in the laser chamber 21 of the amplifier 80. As a result, the pulse laser beam incident on the amplifier 80 performs amplified oscillation at the amplifier 80.

The pulse energy of the pulse laser beam amplified and output by the amplifier 80 is measured at the monitor module 11. The laser control unit 13D controls the charge voltage of the charger 23 of each of the amplifier 80 and the master oscillator 10 so that the measured actual value of the pulse energy becomes closer to the target pulse energy Et.

When the shutter 12 is opened, the pulse laser beam having passed through the beam splitter 11a of the monitor module 11 is incident on the laser processing device 4A illustrated in FIG. 5.

The pulse energy of the pulse laser beam can be increased when the amplifier 80 is provided as in the laser apparatus 3D.

5.2 Modification 2

Figure 18:
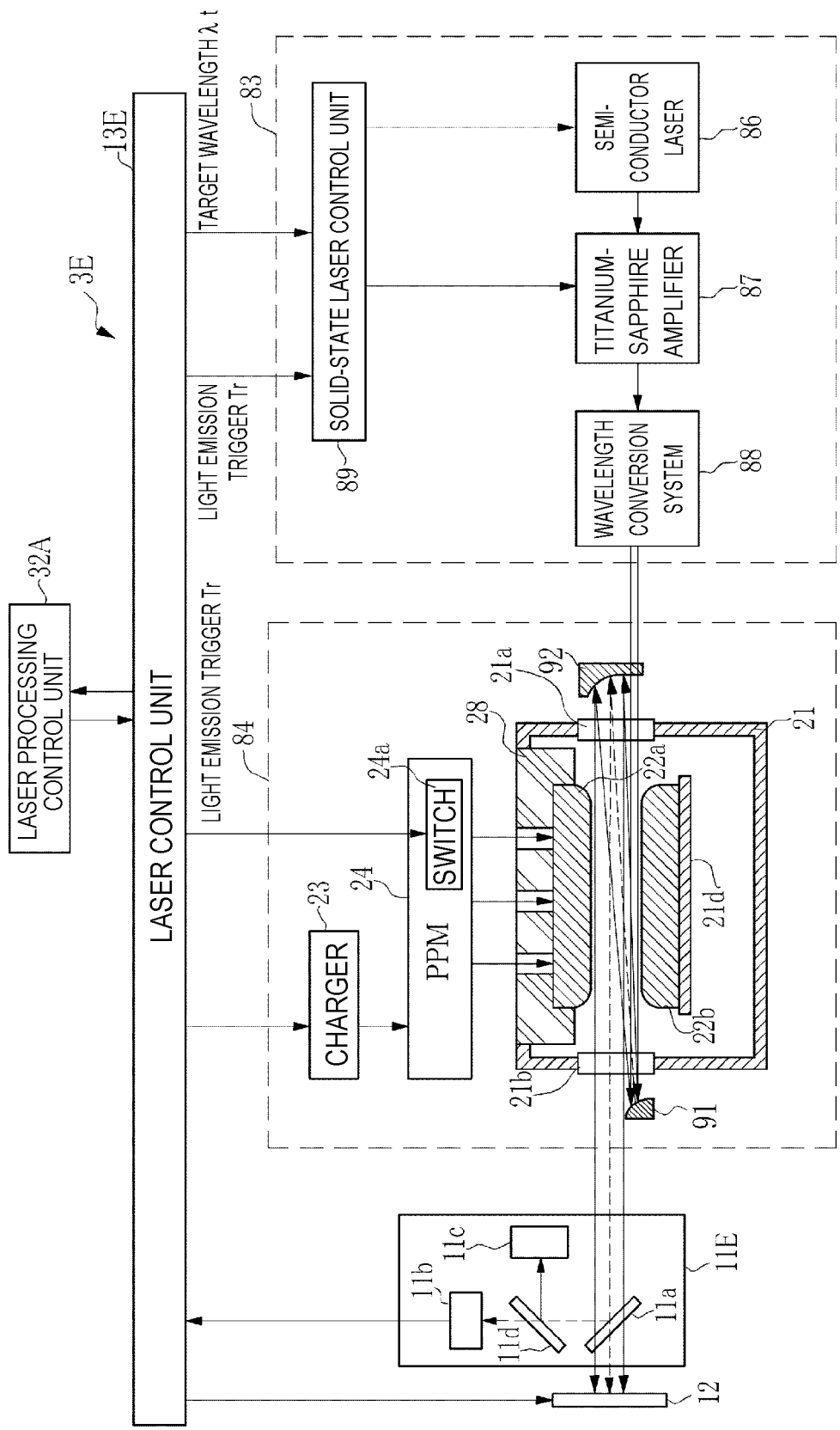
FIG. 18 illustrates Modification 2 of the laser apparatus.

In the laser processing system, a laser apparatus 3E of Modification 2 illustrated in FIG. 18 may be used. The laser apparatus 3E includes a master oscillator 83 and an amplifier 84. The laser apparatus 3E further includes a monitor module 11E in place of the monitor module 11.

The monitor module 11E includes a wavelength monitor 11c and a beam splitter 11d in addition to the configuration of the monitor module 11 of the first embodiment.

In the monitor module 11E, the beam splitter 11d is disposed between the beam splitter 11a and the optical sensor 11b on the reflected light path of the beam splitter 11a. The beam splitter 11d reflects part of light reflected by the beam splitter 11a, and transmits the remaining part. The light having passed through the beam splitter 11d is incident on the optical sensor 11b, and the light reflected by the beam splitter 11d is incident on the wavelength monitor 11c.

The wavelength monitor 11c is a publicly known etalon spectrometer. The etalon spectrometer includes, for example, a diffusion plate, an air gap etalon, a light condensation lens, and a line sensor. The etalon spectrometer generates an interference fringe of an incident laser beam through the diffusion plate and the air gap etalon, and images the generated interference fringe on a light receiving surface of the line sensor through the light condensation lens. Then, the interference fringe imaged on the line sensor is measured to measure the wavelength $\lambda$ of the laser beam.

The master oscillator 83 is a solid-state laser device including a semiconductor laser 86 configured to output a seed beam, a titanium-sapphire amplifier 87 configured to amplify the seed beam, and a wavelength conversion system 88.

The semiconductor laser 86 is a distributed-feedback semiconductor laser configured to output, as the seed beam, a continuous wave (CW) laser beam that is a continuously oscillating laser beam having a wavelength of 773.6 nm. The oscillation wavelength can be changed by changing temperature setting of the semiconductor laser 86.

The titanium-sapphire amplifier 87 includes a titanium-sapphire crystal (not illustrated) and a pumping pulse laser device (not illustrated). The titanium-sapphire crystal is disposed on the optical path of the seed beam. The pumping pulse laser device outputs the second harmonic light of a YLF laser.

The wavelength conversion system 88 generates the fourth harmonic light and includes an LBO ($LiB_3O_5$) crystal and a KBBF ($KBe_2BO_3F_2$) crystal. Each crystal is disposed on a rotation stage (not illustrated) so that the incident angle of the seed beam on the crystal can be changed.

Similarly to the amplifier 80 illustrated in FIG. 17, the amplifier 84 includes the pair of electrodes 22a and 22b, the laser chamber 21 containing ArF laser gas as a laser medium, the pulse power module 24, and the charger 23. Unlike the amplifier 80, the amplifier 84 includes a convex mirror 91 and a concave mirror 92 in place of the output coupling mirror 27 and the rear mirror 26.

The convex mirror 91 and the concave mirror 92 are disposed so that the pulse laser beam output from the master oscillator 83 is enlarged while passing through the electric discharge space of the laser chamber 21 three times through reflection at the convex mirror 91 and the concave mirror 92.

When having received a target wavelength $\lambda t$ and the target pulse energy Et from the laser processing control unit 32A, a laser control unit 13E transmits the target wavelength $\lambda t$ to a solid-state laser control unit 89 of the master oscillator 83. In addition, the laser control unit 13E sets the charge voltage of the charger 23 of the amplifier 84 so that the target pulse energy is achieved.

When having received the target wavelength $\lambda t$ from the laser control unit 13E, the solid-state laser control unit 89 changes an oscillation wavelength $\lambda a1$ of the semiconductor laser 86 so that the wavelength of the seed beam output from the wavelength conversion system 88 becomes equal to the target wavelength $\lambda t$. The oscillation wavelength $\lambda a1$ is set to be four times longer than the target wavelength $\lambda t$, that is, $\lambda a1 = 4\lambda t$. Since the target wavelength $\lambda t$ is 193.4 nm, $\lambda a1$ is $193.4 \times 4 = 773.6$ nm. The amplification by the amplifier 84 using ArF laser gas as a laser medium is possible in a wavelength range of 193.2 nm to 193.6 nm, and thus the target wavelength $\lambda t$ may be changed in the wavelength range as necessary.

The solid-state laser control unit 89 controls the rotation stages (not illustrated) to set the incident angles of the laser beam on the LBO crystal and the KBBF crystal so that the wavelength conversion efficiencies of the crystals are maximum in the wavelength conversion system 88.

When having received the light emission trigger Tr from the laser control unit 13E, the solid-state laser control unit 89 transmits a trigger signal to a pumping pulse laser apparatus of the titanium-sapphire amplifier 87. In the titanium-sapphire amplifier 87, the pumping pulse laser apparatus converts a CW laser beam as the input seed beam into a pulse laser beam based on the trigger signal, and outputs the pulse laser beam. The pulse laser beam output from the titanium-sapphire amplifier 87 is input to the wavelength conversion system 88. The wavelength conversion system 88 performs wavelength conversion of the pulse laser beam at $\lambda a1$ into a pulse laser beam at the target wavelength $\lambda t$ as the fourth harmonic, and outputs the converted pulse laser beam.

When having received the light emission trigger Tr from the laser processing control unit 32A, the laser control unit 13E turns on the switch 24a of the pulse power module 24 so that electric discharge occurs when the pulse laser beam output from the master oscillator 83 is incident in the electric discharge space of the laser chamber 21 of the amplifier 84.

As a result, the pulse laser beam incident on the amplifier 84 from the master oscillator 83 is amplified in the laser chamber 21 while passing through the electric discharge space three times by the effects of the convex mirror 91 and the concave mirror 92. In addition, the beam diameter of the pulse laser beam is increased through the three-time passing.

The amplified pulse laser beam is sampled by the monitor module 11E to measure the actual values of the pulse energy and the wavelength. The laser control unit 13E controls the charge voltage of the charger 23 so that the difference between the measured pulse energy and the measured target pulse energy Et becomes closer to zero. In addition, the laser control unit 13E controls the oscillation wavelength $\lambda a1$ of the semiconductor laser so that the difference between the measured wavelength and the target wavelength $\lambda t$ becomes closer to zero. The pulse laser beam having passed through the beam splitter 11a of the monitor module 11E is incident on the laser processing device when the shutter 12 is opened.

When the master oscillator 83 is a solid-state laser device, the master oscillator 83 is preferably applied as a light source of the laser processing device 4B or 4C illustrated in FIG. 13 or 16. A pulse laser beam output from the master oscillator 83 is similar to a Gaussian beam in a single transverse mode, and thus the beam diameter at the beam waist position can be decreased close to diffraction limit.

In the present example, the amplifier 84 is a multipass amplifier but not limited thereto. For example, the amplifier 84 may be an amplifier including a Fabry-Perot resonator or a ring resonator.

In the present example, the master oscillator 83 is a solid-state laser device, and the laser apparatus 3E is composed of a combination of the solid-state laser device and the amplifier 84 that uses ArF laser gas as a laser medium.

When the amplifier 84 uses KrF laser gas as a laser medium, amplification is possible in a wavelength range of 248.1 nm to 248.7 nm. A laser apparatus in this case may be a wavelength-variable solid-state laser device in which the master oscillator 83 can change wavelength in the wavelength range in which amplification is possible, or may be a line narrowing KrF excimer laser apparatus capable of narrowing of the spectral width. When the amplifier 84 uses $F_2$ laser gas as a laser medium, amplification is possible at a wavelength of 157.6 nm. A laser apparatus in this case is, for example, a solid-state laser device in which the master oscillator 83 oscillates in this wavelength band. As described above, the wavelength of an ultraviolet pulse laser beam is preferably 157.6 nm to 248.7 nm for an amplifier configured to amplify the ultraviolet pulse laser beam.

The description above is intended to be illustrative and the present disclosure is not limited thereto. Therefore, it would be obvious to those skilled in the art that various modifications to the embodiments of the present disclosure would be possible without departing from the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more.

What is claimed is:

1. A laser processing method of performing laser processing on a transparent material that is transparent to ultraviolet light by using a laser processing system including a laser apparatus configured to output a pulse laser beam that is the ultraviolet light, a transfer mask provided with a transfer pattern through which the pulse laser beam passes, and a transfer optical system configured to transfer a transfer image formed when the pulse laser beam passes through the transfer pattern and having a shape in accordance with the transfer pattern, the laser processing method comprising:
   A. a positioning step of performing relative positioning of a transfer position of the transfer image transferred by the transfer optical system and the transparent material in an optical axis direction of the pulse laser beam so that the transfer position is set at a position inside the transparent material at a predetermined depth ΔZsf from a surface of the transparent material in the optical axis direction; and
   B. an irradiation step of irradiating the transparent material with the pulse laser beam having a pulse width of 1 ns to 100 ns inclusive and a beam diameter of 10 μm to 150 μm inclusive at the transfer position, wherein:
   the transparent material is synthetic quartz glass, and the pulse laser beam has a wavelength of 157.6 nm to 248.7 nm,
   the pulse laser beam is an ArF laser beam, and
   the depth ΔZsf is within a range from 0.5 mm to 4 mm inclusive.

2. The laser processing method according to claim 1, wherein the pulse laser beam has a fluence of 3 J/cm$^2$ to 15 J/cm$^2$ inclusive at the transfer position.

3. The laser processing method according to claim 1, wherein a number of irradiation pulses of the pulse laser beam is 3,000 or larger.

4. The laser processing method according to claim 3, wherein the number of irradiation pulses is 35,000 or smaller.

5. The laser processing method according to claim 1, wherein the laser apparatus includes:
   a master oscillator; and
   an amplifier configured to amplify the pulse laser beam output from the master oscillator.

6. The laser processing method according to claim 5, wherein the master oscillator includes a solid-state laser device.

7. The laser processing method according to claim 6, wherein the solid-state laser device includes a wavelength conversion system including a plurality of crystals.

8. The laser processing method according to claim 6, wherein the solid-state laser device includes a wavelength variable laser device that can change wavelength.

9. A laser processing system configured to perform laser processing by irradiating a transparent material that is transparent to ultraviolet light with a pulse laser beam that is the ultraviolet light, the laser processing system comprising:
   A. a laser apparatus configured to output the pulse laser beam having a pulse width of 1 ns to 100 ns;
   B. a transfer mask provided with a transfer pattern through which the pulse laser beam output from the laser apparatus passes;
   C. a transfer optical system configured to transfer, onto the transparent material, a transfer image formed when the pulse laser beam passes through the transfer pattern and having a shape in accordance with the transfer pattern;
   D. a positioning mechanism configured to perform relative positioning of a transfer position of the transfer image transferred by the transfer optical system and the transparent material in an optical axis direction of the pulse laser beam; and
   E. a positioning control unit configured to control the positioning mechanism to perform the positioning so that the transfer position is set at a position inside the transparent material at a predetermined depth ΔZsf from a surface of the transparent material in the optical axis direction,
   the pulse laser beam having a beam diameter of 10 μm to 150 μm inclusive at the transfer position, wherein:
   the transparent material is synthetic quartz glass, and the pulse laser beam has a wavelength of 157 nm to 248 nm,
   the pulse laser beam is an ArF laser beam,
   the depth ΔZsf is within a range from 0.5 mm to 4 mm inclusive.

10. The laser processing system according to claim 9, wherein the pulse laser beam has a fluence of 3 J/cm$^2$ to 15 J/cm$^2$ inclusive at the transfer position.

11. The laser processing system according to claim 9, wherein the number of irradiation pulses of the pulse laser beam is 3,000 or larger.

12. The laser processing system according to claim 9, wherein:
   the laser apparatus includes:
   a master oscillator including a solid-state laser device; and
   an amplifier configured to amplify the pulse laser beam output from the master oscillator, and
   the solid-state laser device includes a wavelength conversion system including a plurality of crystals.

13. A laser processing method of performing laser processing on a transparent material that is transparent to ultraviolet light by using a laser processing system including a laser apparatus configured to output a pulse laser beam that is the ultraviolet light, a transfer mask provided with a transfer pattern through which the pulse laser beam passes, and a transfer optical system configured to transfer a transfer image formed when the pulse laser beam passes through the transfer pattern and having a shape in accordance with the transfer pattern, the laser processing method comprising:
   A. a positioning step of performing relative positioning of a transfer position of the transfer image transferred by the transfer optical system and the transparent material in an optical axis direction of the pulse laser beam so that the transfer position is set at a position inside the transparent material at a predetermined depth ΔZsf from a surface of the transparent material in the optical axis direction; and
   B. an irradiation step of irradiating the transparent material with the pulse laser beam having a pulse width of 1 ns to 100 ns inclusive and a beam diameter of 10 μm to 150 μm inclusive at the transfer position, wherein:

the transparent material is synthetic quartz glass, and the pulse laser beam has a wavelength of 248.1 nm to 248.7 nm, the pulse laser beam is a KrF laser beam, and the depth $\Delta Zsf$ is within a range from 0.5 mm to 4 mm inclusive.

14. The laser processing method according to claim 13, wherein the pulse laser beam has a fluence of 3 J/cm² to 15 J/cm² inclusive at the transfer position.

15. The laser processing method according to claim 13, wherein a number of irradiation pulses of the pulse laser beam is 3,000 or larger.

16. The laser processing method according to claim 15, wherein the number of irradiation pulses is 35,000 or smaller.

17. The laser processing method according to claim 13, wherein the laser apparatus includes:

a master oscillator; and an amplifier configured to amplify the pulse laser beam output from the master oscillator.

18. The laser processing method according to claim 17, wherein the master oscillator includes a solid-state laser device.

19. The laser processing method according to claim 18, wherein the solid-state laser device includes a wavelength conversion system including a plurality of crystals.

20. The laser processing method according to claim 18, wherein the solid-state laser device includes a wavelength variable laser device that can change wavelength.

\* \* \* \* \*